(12) United States Patent
Matsumura et al.

(10) Patent No.: US 7,583,716 B2
(45) Date of Patent: Sep. 1, 2009

(54) SEMICONDUCTOR LASER DEVICE

(75) Inventors: Hiroaki Matsumura, Tokushima (JP); Yasuhisa Kotani, Anan (JP)

(73) Assignee: Nichia Corporation, Anan (JP)

( * ) Notice: Subject to any disclaimer, the term of this patent is extended or adjusted under 35 U.S.C. 154(b) by 513 days.

(21) Appl. No.: 11/072,413

(22) Filed: Mar. 7, 2005

(65) Prior Publication Data
US 2006/0078024 A1    Apr. 13, 2006

(30) Foreign Application Priority Data

| Mar. 5, 2004 | (JP) | ............................. 2004-062882 |
| Mar. 22, 2004 | (JP) | ............................. 2004-082181 |
| Mar. 1, 2005 | (JP) | ............................. 2005-056085 |

(51) Int. Cl.
*H01S 5/00* (2006.01)

(52) U.S. Cl. .............. 372/46.01; 372/46.014; 372/43.01

(58) Field of Classification Search ............. 372/43.01, 372/46.01, 46.014
See application file for complete search history.

(56) References Cited

U.S. PATENT DOCUMENTS

| 4,282,494 A | 8/1981 | Yonezu et al. |
| 5,084,892 A | 1/1992 | Hayakawa |
| 5,247,536 A | 9/1993 | Kinoshita |
| 6,414,976 B1 * | 7/2002 | Hirata .................. 372/45.013 |
| 6,826,223 B1 * | 11/2004 | Meyer et al. .................. 372/96 |
| 6,831,937 B2 * | 12/2004 | Doi et al. ................. 372/43.01 |
| 7,103,082 B2 * | 9/2006 | Sugimoto et al. .......... 372/50.1 |
| 7,212,556 B1 * | 5/2007 | Kume et al. .............. 372/43.01 |
| 2002/0018501 A1 | 2/2002 | Hatakoshi et al. |
| 2002/0145150 A1 * | 10/2002 | Okuyama et al. ............. 257/91 |
| 2004/0165635 A1 | 8/2004 | Sugimoto et al. |
| 2004/0264903 A1 * | 12/2004 | Dridi et al. .................. 385/129 |
| 2006/0165984 A1 * | 7/2006 | Miguez et al. .............. 428/375 |

FOREIGN PATENT DOCUMENTS

| EP | 0 468 482 A | 1/1992 |
| JP | 2-199889 A | 8/1990 |
| JP | 2000-196199 A | 7/2000 |
| JP | 2002-270967 A | 9/2002 |
| WO | WO 02/101894 A | 12/2002 |

* cited by examiner

*Primary Examiner*—Minsun Harvey
*Assistant Examiner*—Delma R Forde
(74) *Attorney, Agent, or Firm*—Smith Patent Office

(57) ABSTRACT

A semiconductor laser device having a far field pattern (FFP) with a Gaussian distribution that is less prone to ripples is provided. The semiconductor laser device comprises a semiconductor layer having a first conductivity type, an active layer, a semiconductor layer having a second conductivity type, a waveguide region formed by restricting current within a stripe-shaped region in the semiconductor layer of the second conductive type, and a resonance surface provided on an end face substantially perpendicular to the waveguide region. A plurality of recesses is formed at positions spaced from the waveguide region in the semiconductor layer of the second conductivity type in a region adjacent to the resonance surface.

27 Claims, 19 Drawing Sheets

SEMICONDUCTOR LASER DEVICE

FIELD OF THE INVENTION

The present invention relates to a semiconductor laser device having a favorable far field pattern (hereinafter referred to as FFP).

DISCUSSION OF THE RELATED ART

The semiconductor laser device of the present invention can be used in any apparatus, for example, an optical disk, an optical communication system, a printer or a measuring instrument.

In a semiconductor laser, a striped structure is formed so as to control the transverse mode of light, thereby causing resonance of light in a waveguide region of the striped shape. When light leaks out of the waveguide region, stray light that has leaked escapes from an end face as weak light, that becomes noise superposed on the main beam, thus causing ripples in FFP. This phenomenon becomes conspicuous particularly in a semiconductor laser of high output power. Since such noise (ripples) causes various trouble when the laser is coupled to an optical fiber or a lens, there are demands for a semiconductor laser that has high output power and can form a FFP that is free of ripples.

Japanese Unexamined Patent Publication No. 2000-196199 filed by the present applicant, for example, proposes a semiconductor laser device made by stacking semiconductors including an active layer of a multiple quantum well structure comprising a well layer and a barrier layer formed on a substrate, wherein a light absorbing layer is formed between an n-type contact layer and the substrate. The light absorbing layer is an undoped In-based layer that has a smaller band gap energy than that of the well layer of the active layer. When a part of the light emitted from the active layer leaks out of the n-type cladding layer, it may propagate in the n-type contact layer that has a higher refractive index than that of the substrate. Since this stray light also causes ripples, a light absorbing layer is formed below the n-type contact layer so as to absorb the stray light, thereby suppressing the ripples.

Japanese Unexamined Patent Publication No. 2000-196199 proposes a semiconductor laser device made by forming a light absorbing layer by growing $In_{0.15}Ga_{0.85}N$ to a thickness of 0.2 μm on a substrate, and forming thereon an n-type contact layer, an n-type cladding layer, an active layer, etc. In the laser device having such a construction, the light absorbing layer absorbs light that has leaked toward the substrate from the n-type cladding layer which functions as a light confinement layer, thereby suppressing ripples.

However, the effect of the semiconductor laser device of the prior art to suppress ripples is not sufficient. The semiconductor laser device described in Japanese Unexamined Patent Publication No. 2000-196199 has such a structure as the light absorbing layer is added to the stacked structure of semiconductors. While it is necessary to form the light absorbing layer in such a construction that includes In with a concentration enough to develop the light absorbing effect, a nitride semiconductor that includes too much In generally has a low crystallinity. As a result, other layers formed on the light absorbing layer tend to have low crystallinity, which may result in restrictions imposed on the thickness and/or the composition of the other layers in order to avoid the low crystallinity.

SUMMARY OF THE INVENTION

An object of the present invention is to provide a semiconductor laser device that has a FFP with a Gaussian distribution so that it is less prone to ripples.

The semiconductor laser device of the present invention comprises a semiconductor layer of a first conductivity type, an active layer, a semiconductor layer of a second conductivity type having a different conductivity type from that of the first conductivity type, a waveguide region formed by restricting current within a stripe-shaped region in the semiconductor layer of the second conductivity type, and a resonance surface provided on an end face substantially perpendicular to the waveguide region, wherein a plurality of recesses are formed at positions spaced from the waveguide region in the semiconductor layer having the second conductivity type in a region adjacent to the resonance surface.

With the construction described above, it is made possible to prevent stray light from coming out of the resonance surface near the waveguide, because the stray light is scattered and/or refracted by the plurality of recesses. The recesses are preferably located on the light extracting end face side of the resonance surface.

The number of the recesses to be formed is preferably two or more, which results in a high scattering effect. Moreover, the semiconductor laser device preferably has recesses on both sides of the waveguide region. This configuration achieves an effect of forming the beam in a more symmetrical shape.

The waveguide region in the present invention is a stripe-shaped region through which light propagates. Light propagating in this region is amplified through resonance on the resonance surface, thus achieving laser oscillation. In the waveguide region, current is restricted so as to inject the current efficiently into the waveguide region. In order to restrict the current in the waveguide region, the semiconductor layer of the second conductivity type has a cross section preferably of a convex shape when viewed from the resonance surface side, since this configuration has a light confinement effect, too. In the description that follows, this convex portion will also be referred to as a ridge.

The substrate is preferably a monolithic substrate made of a single semiconductor. However, the substrate may have a material different from the semiconductor that constitutes the substrate surface that is provided over a part or all of the substrate. The material different from the semiconductor to be provided as the substrate is, for example, sapphire, SiC, Si, spinel, $SiO_2$, SiN or the like. The semiconductor is preferably a compound semiconductor, especially a group III-V compound semiconductor, II-VI compound semiconductor, or the like, specifically GaN compound semiconductor, GaAs compound semiconductor, ZnO compound semiconductor or the like.

The recesses are located preferably on the light extracting end face side of the resonance surface. This configuration enables it to prevent a FFP from being disturbed regardless of the resonator length and ridge width.

The recess is preferably located in contact with the resonance surface and/or in the vicinity of the resonance surface. The expression that the recess is located in contact with the resonance surface means that the periphery of the recess touches the resonance surface. The expression that the recess is in the vicinity of the resonance surface means that the shortest distance between the periphery of the recess and the resonance surface is 10 µm or less. This configuration reduces the propagation loss, and makes it easier to ensure linearity of the semiconductor laser. Meanwhile, leakage of light from the waveguide occurs over the entire waveguide in the longitudinal direction thereof. Thus ripples can be more effectively prevented from occurring by scattering and refracting the light at a position as near as possible to the light extracting end face.

Furthermore, it is preferable that the recesses are in contact with or cross the light extracting end face, and a notch is formed in the light extracting end face. This configuration enables it to stabilize the cleaving position in a process of forming the resonance surface by cleaving. As a result, the semiconductor laser device chips having the same shape as the end face can be provided.

In the semiconductor laser device of the present invention, the side face of the recess is preferably inclined from the principal surface of the substrate in a cross section parallel to the resonance surface. This configuration improves the scattering effect.

In the semiconductor laser device of the present invention, the shape of the recess as viewed from above is preferably, for example, circular, triangular, hexagonal, a parallelogram, linear or curvilinear. Such a configuration enables control of the scattering and refracting effects. The process becomes easier especially when a planar configuration of the recess is circular or hexagonal. In case where the recesses are formed in a circular shape, the diameter of the circle is preferably in a range from 1 to 10 µm, or more preferably from 2 to 5 µm.

In the semiconductor laser device of the present invention, the bottom of the recess is preferably located in the semiconductor layer of the first conductivity type. Since the semiconductor laser device is made by stacking the semiconductor layer of the first conductivity type, the active layer and the semiconductor layer of the second conductivity type in this order on the principal surface of the substrate, the bottom of the recess reaches the semiconductor layer of the first conductivity type by penetrating through the semiconductor layer of the second conductivity type and the active layer. With this configuration, the effect of scattering stray light can be improved.

It is preferable that a light absorbing layer is provided in the recess. This enables it to not only scatter and refract the stray light but also absorb it when the stray light passes through the recess. As a result, the ripples in the FFP can be suppressed more effectively.

The light absorbing layer is preferably made of a semiconductor that has a narrower band gap than that of the active layer. Specifically, in the case where a GaN semiconductor that includes In is used to form the active layer, the light absorbing layer is preferably made of a GaN semiconductor that has a higher proportion of In in the mixed crystal than in the active layer. An InP semiconductor or a GaAs semiconductor may also be used. Such a semiconductor enables it to absorb light efficiently.

The light absorbing layer formed in the recess is at least one selected from a group consisting of Ni, Cr, Ti, Cu, Fe, Zr, Hf, Nb, W, Rh, Ru, Mg, Si, Al, Sc, Y, Mo, Ta, Co, Pd, Ag, Au, Pt, In, an oxide thereof, SiN, BN, SiC and AlN. Some of these materials not only absorb but also scatter light. Such a construction enables it to absorb light efficiently. SiN, BN, SiC and AlN are preferably amorphous.

Another aspect of the present invention is a semiconductor laser device that comprises a semiconductor layer of a first conductivity type, an active layer, a semiconductor layer of a second conductivity type having a conductivity type different from the first conductivity type, a ridge of a stripe shape formed in the semiconductor layer of the second conductivity type, and a resonance surface provided on an end face substantially perpendicular to the ridge, wherein an ion implantation regions and recesses are formed on the surface of the semiconductor layer of the second conductivity type at positions located away from the side face of the ridge.

With the construction described above, it is made possible to not only scatter the stray light but also absorb it by the recess in the vicinity of the stripe-shaped ridge. While the wavelength of stray light that can be absorbed depends on the material, it is preferably in a region from below 365 nm, which is ultraviolet, to 600 nm. A favorable FFP can be obtained by absorbing stray light that propagates in a core region including the active layer and the guide layer.

The ridge functions as the waveguide region, where light is confined in the stripe-shaped region. The ridge has a convex cross section, where light confined therein is amplified thus effecting laser oscillation, with the laser beam emitted from the light extracting end face side of the resonance surface. The ridge is a narrowing region where current can be injected efficiently, and also has a light confinement function.

The ion implantation region is preferably formed near the ridge on the light extracting end face side of the resonance surface. Since crystallinity of the waveguide region becomes lower when the ion implantation region is in contact with the ridge, it is necessary to keep the ion implantation region away from the ridge. The ion implantation region is preferably formed to extend toward the outside from the region located 1 to 10 µm from the ridge on both sides thereof. The ion implantation region is preferably located within 20 µm from the light extracting end face in the direction of the ridge stripe.

The ion implantation region and the recesses are preferably formed in this order from the light extracting end face side of the resonance surface toward the reflecting end face side. This construction makes it possible to scatter and refract light that has returned from the reflecting end face in the recess and absorb the light propagating on the light extracting end face side in the ion implantation region. With this construction, the semiconductor laser device with a main beam that has a FFP with fewer ripples superposed thereon can be easily obtained. It is preferable that the ion implantation region exists starting at the light extracting end face, and that the distance between the light extracting end face and the recesses is 1 µm or more.

Such a construction may also be employed where a first ion implantation region, the recess and a second ion implantation region are formed in this order from the light extracting end face side of the resonance surface toward the reflecting end face side. This construction makes it possible to absorb light, that has returned from the reflecting end face, in the first ion implantation region, scatter and refract stray light in the recess and absorb the light propagating on the light extracting end face side in the second ion implantation region.

While the first ion implantation region absorbs the stray light, the second ion implantation region has the effect of decreasing capacitance as well. That is, the second ion implantation region located below the electrode decreases the capacitance of the semiconductor laser. When the capacitance of the semiconductor laser decreases, it improves the response speed of the semiconductor laser and is therefore advantageous. When Al is injected in the first region, for example, the second region is preferably injected with B or Al. It is preferable that the first ion implantation region and the recess, and the recess and the second ion implantation region are both continuous.

In the semiconductor laser device of the present invention, the ion injected into the ion implantation region is preferably at least one selected from a group consisting of aluminum (Al), boron (B), magnesium (Mg), zinc (Zn), beryllium (Be), carbon (C), calcium (Ca) and hydrogen (H). These materials can easily form the ion implantation region in the depth direction, specifically into a layer further below the active layer.

Further another aspect of the present invention is a semiconductor laser device that comprises a semiconductor layer of a first conductivity type, an active layer, a semiconductor layer of a second conductivity type having a conductivity type different from the first conductivity type, a stripe shape ridge formed in the semiconductor layer of the second conductivity type, and a resonance surface provided on an end face substantially perpendicular to the ridge that is formed on the principal surface of a substrate, wherein a light absorbing region and a light scattering region, that are provided at least in the semiconductor layer of the second conductivity type, are provided at positions located away from the side face of the ridge. The light scattering region is a region that can scatter the stray light.

In the semiconductor laser device of the present invention, the semiconductor layer of the first conductivity type, the active layer and the semiconductor layer of the second conductivity type are made of nitride semiconductors. Nitride semiconductors are represented by the general formula

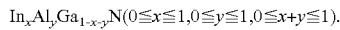

$In_xAl_yGa_{1-x-y}N(0 \leq x \leq 1, 0 \leq y \leq 1, 0 \leq x+y \leq 1)$.

The first semiconductor layer preferably has an n-type nitride semiconductor and the second semiconductor layer preferably has a p-type nitride semiconductor. The n-type nitride semiconductor preferably includes at least one kind of n-type impurity such as Si, Ge or O. The p-type nitride semiconductor preferably includes a p-type impurity such as Mg or Zn.

The semiconductor laser device of the present invention can suppress ripples in the FFP of the laser beam. Mode hopping in the longitudinal direction can also be suppressed. The laser beam having less ripples in FFP pattern makes it easier to couple the laser with other optical devices such as lens and optical fiber, and to design the lens.

DETAILED DESCRIPTION OF THE PREFERRED EMBODIMENTS

Embodiment 1

Figure 1:
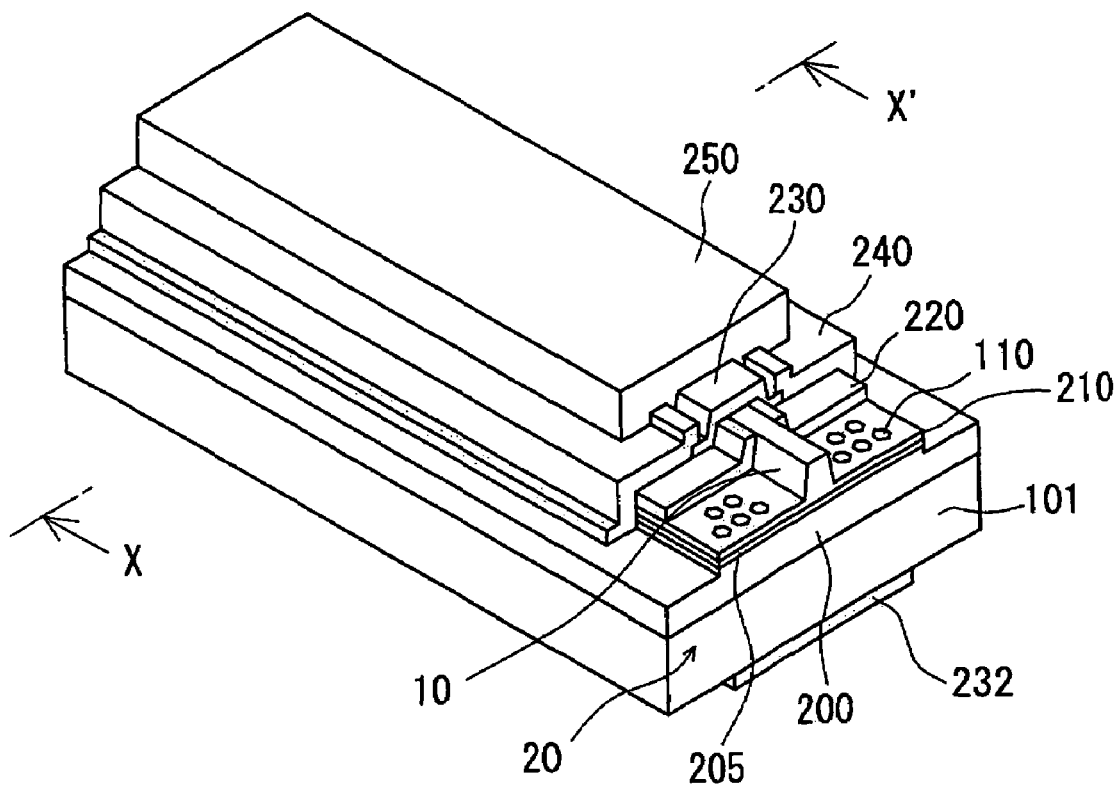
FIG. 1 is a schematic perspective view of a semiconductor laser device according to a first embodiment.

FIG. 1 is a schematic perspective view of a semiconductor laser device according to a first embodiment of the present invention. The semiconductor laser device comprises a nitride semiconductor layer 200 of a first conductivity type, an active layer 205 and a semiconductor layer 210 of a second conductivity type stacked on a first principal surface of a semiconductor substrate 101 that has the first principal surface and the second principal plane. The substrate 101 has electrical conductivity, and has an opposing electrode structure where electrodes are formed on the second principal surface of the substrate 101 and on the semiconductor layer 210 having the second conductivity type. The opposing electrode structure enables it to draw a large current which results in a high power oscillation. The semiconductor layer 210 of the second conductivity type has a ridge 10 of a stripe shape formed thereon, thus resulting in a waveguide region of stripe shape formed below the ridge 10. An end face 20 that is substantially perpendicular to the waveguide region becomes the resonance surface of the laser.

Figure 2:
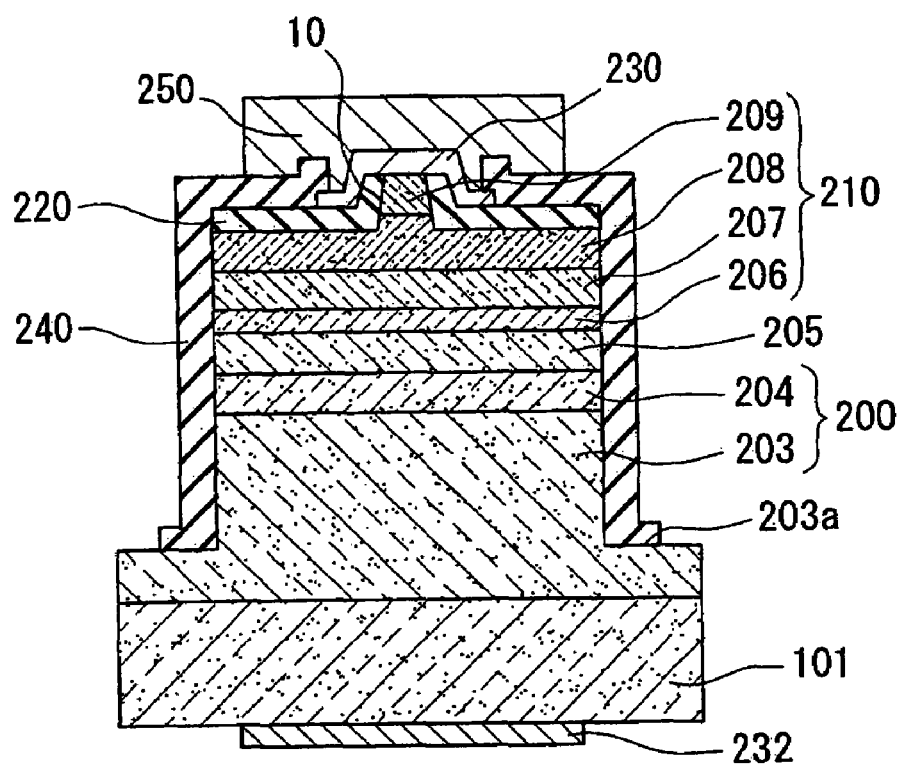
FIG. 2 is a schematic cross sectional view of the semiconductor laser device according to the first embodiment taken along line X-X'.

FIG. 2 is a sectional view taken along lines X-X' showing the detailed structure of the semiconductor laser shown in FIG. 1. The semiconductor laser of this embodiment has a separate confinement (SCH) type structure. But, the present invention is not limited to the separate confinement type but is also applicable to a structure without an optical guide layer. Stacked on the substrate 101 are an n-type cladding layer 203, an n-side optical guide layer 204, an active layer 205, a p-side electron confinement layer 206, a p-side optical guide layer 207, a p-side cladding layer 208 and a p-side contact layer 209. The n-side cladding layer 203 and the n-side optical guide layer 204 constitute the semiconductor layer 200 of the first conductivity type. On the other hand, the p-side electron confinement layer 206, the p-side optical guide layer 207, the p-side cladding layer 208 and the p-side contact layer 209 constitute the semiconductor layer 210 of the second conductivity type. The p-side electron confinement layer may be also referred to as a p-side cap layer.

The ridge 10 used for forming the waveguide is formed by removing part of the p-side contact layer 209 and part of the p-side cladding layer 208 by etching, while leaving the ridge-shaped portion. Formed on both sides of the ridge 10 are insulation films 220 in such a way that the top surface of the p-side contact layer 209 is exposed. The insulation films 220 may be also referred to as insulation layers or embedding layers. A p-electrode 230 is formed on the surface of the p-side contact layer 209 that is exposed and, in addition, a p pad electrode 250 is formed thereon. An n electrode 232 is formed on the back surface of the substrate 101.

A part of the n-side semiconductor layer 200 is exposed by etching through the p-side contact layer 209 down to midway in the n-side cladding layer 203. An exposed surface 203a of the n-side layer makes a dicing line for dividing the wafer into individual devices. This etching operation also relieves the entire wafer of stress. A protective film 240 is formed on the side face of the exposed semiconductor layer.

The semiconductor laser device of this embodiment comprises a plurality of recesses 110 formed on the surface of the semiconductor layer 210 of the second conductivity type at positions located away from the ridge 10 that forms the waveguide region as shown in FIG. 1. The recesses 110 shown in FIG. 1 have a depth that reaches the semiconductor layer 200 of the first conductivity type. The plurality of recesses 110 are disposed in a matrix configuration in the vicinity of the resonance surface 20.

By forming the plurality of recesses 110 in the vicinity of the resonance surface 20, it is made possible to scatter light, that has leaked from the waveguide region of the semiconductor laser, by means of the recesses 110. As a result, leaking light that is emitted in the direction of the main beam of the laser is suppressed, thus resulting in a FFP having reduced ripples.

In the construction shown in FIG. 1, the insulation layer 220 and the p electrode 230 are not formed in the region where the recesses 110 are formed. However, the insulation layer 220 may be formed so as to extend into the region where the recesses 110 are formed, in order to protect the semiconductor layer exposed in the recesses 110. The p electrode 230 preferably does not cover the region where the recesses 110 are formed. This is because doing so may cause short-circuiting with the p electrode 230, since the semiconductor layer 200 of the first conductivity type is exposed in the recess 110.

The recesses 110 are formed to such a depth so that light that has leaked from the waveguide can be scattered. For example, the recesses 110 are formed preferably to such a depth so the bottom of the recess reaches at least the semiconductor layer 200 of the first conductivity type, in order to effectively scatter the light that has leaked sideways from the active layer 205. Particularly in the case of a semiconductor laser of a separate confinement (SCH) type as in this embodiment, it is preferable that the bottom of the recesses 110 reaches a depth below the lower surface of the optical guide layer 204 in the semiconductor layer 200 of the first conductivity type. In other words, it is preferable that the bottom of the recesses 110 reach the cladding layer 203 located in the semiconductor layer 200 of the first conductivity type. This enables it to effectively scatter the light that has leaked from the waveguide that comprises the n-side optical guide layer 204, the active layer 205 and the p-side optical guide layer 207. Moreover, since light leaks also into the n-side cladding layer, it is more preferable that the recesses are formed to midway down the n-side cladding layer. It is also preferable that the bottom of the recesses 110 lie in the same plane as the surface 203a of the n-side semiconductor layer that has been exposed in order to define the width of the laser device (or to expose the electrode forming surface). This makes it possible to reduce the number of mask aligning operations required when etching the semiconductor laser device, improve the yield when manufacturing the semiconductor laser and suppress the variations in the characteristics of the semiconductor laser.

The recesses 110 are preferably formed on the light extracting end face 20 side of the resonance surface. By forming the recesses 110 in the vicinity of the light extracting end face 20, it is possible to scatter the light leaking from the light extracting end face 20 and reduce the light that leaks in the same direction as the main beam of the laser. Thus ripples generated on the FFP can be suppressed effectively. The recesses 110 may be formed both in the vicinity of the light extracting end face 20 and in the vicinity of the light reflecting end face. When the recesses 110 are formed also in the vicinity of the reflecting end face, light that is reflected by the reflecting end face of the laser toward the inside of the laser can be scattered to the outside. As a result, leaking light that repeats propagation in the laser can be decreased so as to suppress ripples more effectively.

When the recesses 110 are formed at a position too far away from the resonance end face, the efficiency of the light emission may decrease. Therefore, it is desirable to form the recesses 110 in a region at a distance within 30 μm, more preferably 10 μm from the resonance surface.

If the recesses 110 are located too near the waveguide, damage may be caused to the semiconductor crystal within the waveguide when forming the recesses 110. Therefore, it is desirable to form the recesses 110 so that periphery of the recess is at a distance of at least 0.1 μm, more preferably 0.5 μm or more from the periphery of the waveguide (the ridge 10 in this embodiment). When the recesses 110 are formed too far away from the waveguide, however, the effect of suppressing ripples decreases. Therefore, it is desirable that the shortest distance between the periphery of the recess 110 and the periphery of the waveguide is 15 μm or less, and more preferably 10 μm or less.

The recesses 110 may have various planar configurations. FIG. 3A through FIG. 3D schematically show examples of the planar configurations of the recess 110. Planar configurations of the recess 110 are the shapes in 2 dimensions when looking at the recess and these shapes may be anything that can scatter (or refract when viewed microscopically) light that has leaked from the waveguide, so that the light is emitted in directions other than the propagating direction of the main beam. For example, a circle (FIG. 3A), a hexagon (FIG. 3B), a triangle (FIG. 3C), linear (FIG. 3D) or other shapes may be employed. As can be seen from these examples, in order to scatter/refract light, that has leaked from the waveguide 110, so that the light propagates in directions other than the direction of the main beam, planar configurations of the recess 110 are preferably the circle or the oval where the tangent changes its direction continuously, or is constituted from sides that are inclined from the light extracting end face 20.

Figure 3A:
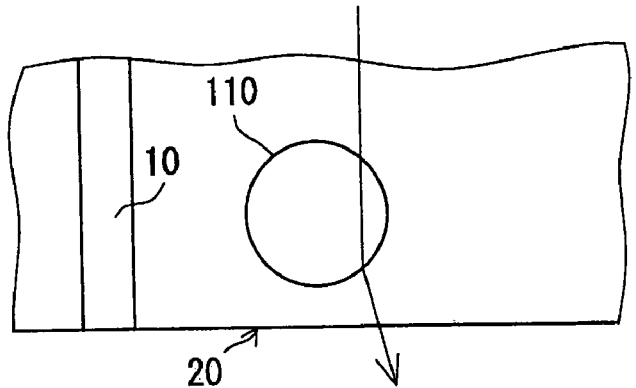
FIG. 3A is a schematic plan view showing an example of a planar configuration of a recess.

For example, when the planar configuration of the recess 110 is a circle as shown in FIG. 3A, light that has been propagating in a direction parallel to the waveguide is deflected into a direction other than the propagating direction of the main beam (perpendicular to the light extracting end face), except for the case when it passes through the center of the circle. The same applies to a case where the planar configuration of the recess 110 is oval. Thus by arranging a number of recesses 110 having planar configurations of circles or ovals, it is possible to suppress the influence of leaking light on the main beam and obtain a favorable FFP.

Figure 3B:
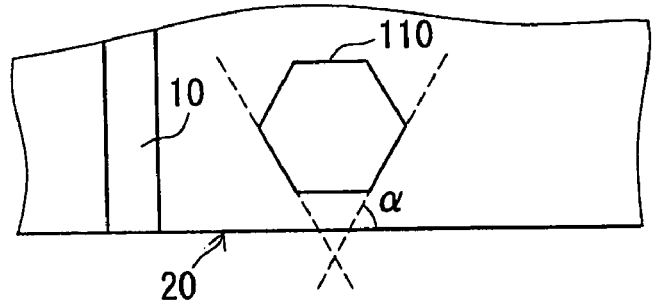
FIG. 3B is a schematic plan view showing another example of the planar configuration of the recess.
Figure 3C:
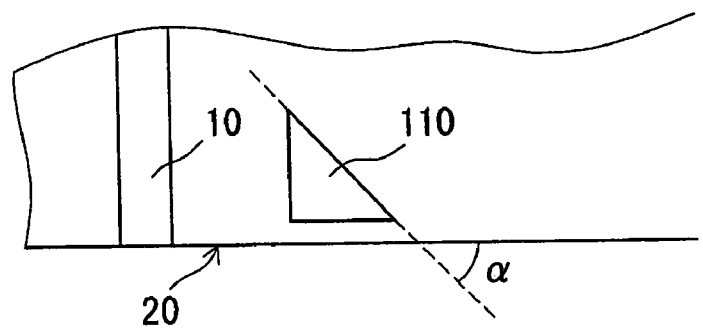
FIG. 3C is a schematic plan view showing a different example of the planar configuration of the recess.
Figure 3D:
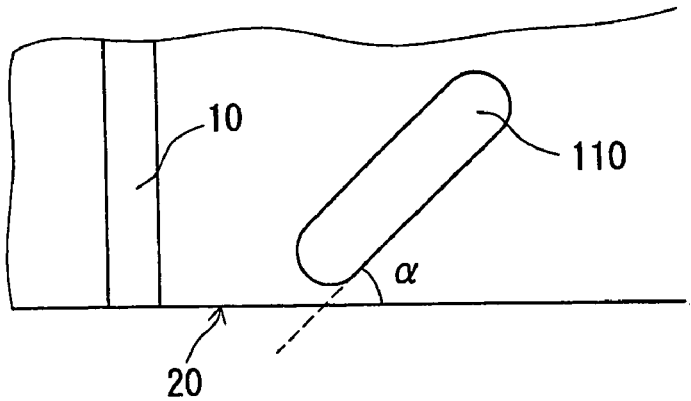
FIG. 3D is a schematic plan view showing another example of the planar configuration of the recess.

In case the recess is formed in a shape that has a side inclined by an angle α from the light extracting end face 20 as shown in FIG. 3B through FIG. 3D, light passing through the side is also deflected into a direction other than the propagating direction of the main beam. In order to effectively suppress ripples due to the leaking light, the angle α of the side of the recess 110 in the planar configuration is preferably in a range from 5 to 70°, and more preferably 10 to 60°. The planar configuration of the recess 110 is preferably determined in accordance with the crystal orientation of the semiconductor layer that forms the recess. For example, in case the semiconductor forms a hexagonal crystal system (nitride semiconductor crystal or the like) and the light extracting end face is formed in the M plane of the hexagonal crystal system, the planar configuration of the recess 110 is preferably a hexagon that has a side parallel to the light extracting end face 20, as shown in FIG. 3B. Such a shape enables it to form the recesses 110 with a stable configuration and dimensions. The planar configurations of the recesses 110 are not limited to the examples described above.

Whatever the planar configuration the recess 110 is, the width of the recess 110 is preferably 0.1 μm or more, and more preferably 0.5 μm or more across the narrowest portion thereof. Especially, if the recess has a circular planar shape, the diameter of the circle is preferably 0.1 μm or more, more preferably 0.5 μm or more. This is because the recess 110 is likely to lose its shape when it is too narrow.

While there is no restriction on the number of recesses 110 to be formed in the semiconductor layer 210 of the second conductivity type, it is preferable that a plurality of recesses are disposed along both directions parallel to the waveguide region of stripe shape and perpendicular thereto. For example, when three recesses are disposed along both directions parallel and perpendicular to the waveguide region of stripe shape in a checkered pattern, nine recesses are formed in total. The recesses 110 may be disposed at equal or varying distances from each other. Since light transmits through the gap between the recesses 110, the recesses 110 in the even-numbered columns and the recesses 110 in the odd-numbered columns are preferably located at staggered positions. Particularly, when the recesses 110 are viewed in the direction of the waveguide from the resonance surface, the recesses 110 in the odd-numbered columns and the recesses 110 in the even-numbered columns are located so as to make contact with or overlap each other, which improves the efficiency of scattering the leaking light. Also the recesses 110 preferably extend in a direction perpendicular to the waveguide, rather than in a direction parallel to the waveguide, in order to effectively suppress ripples without decreasing the efficiency of the light emission.

Figure 4A:
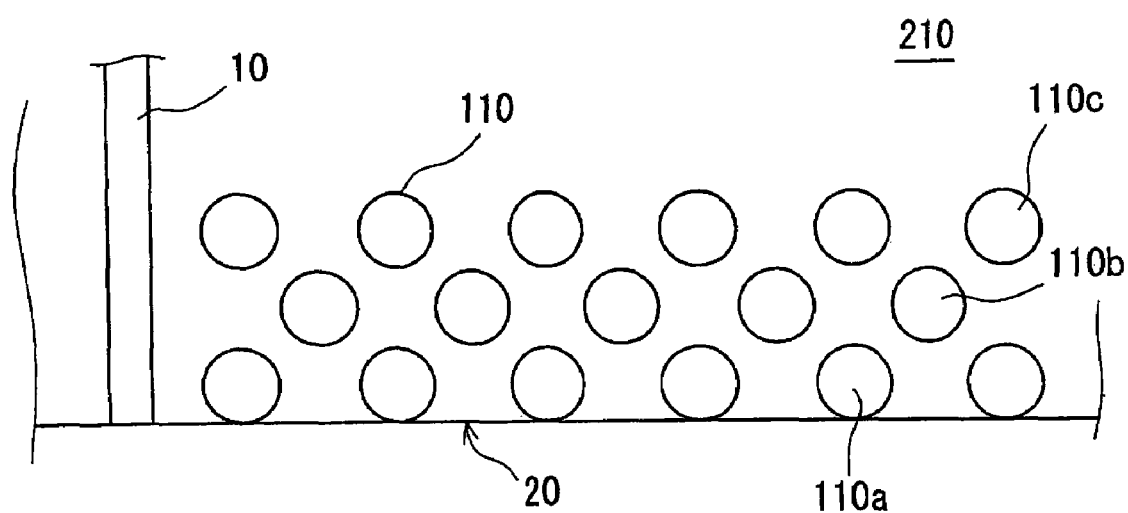
FIG. 4A is a schematic plan view showing an example of arranging circular recesses.

An example of a specific arrangement of the recesses 110 will be described below. FIG. 4A through FIG. 4D schematically show examples of arrangements of the recesses 110 having circular shaped cross sections. In the example shown in FIG. 4A, the recesses 110 are arranged at equal intervals in the direction perpendicular to the ridge 10, and the arrangement of the recesses 110 is repeated in three columns in parallel to the ridge 10. In the example shown in FIG. 4A, spacing between the recesses 110 (namely the shortest distance between peripheries of the recesses 110) is substantially the same as the diameter of the recess 110. As shown in FIG. 4A, recesses 110b in the second column are disposed at positions displaced by a half of the pitch from recesses 110a in the first column, and recesses 110c in the third column are also disposed at positions displaced by a half of the pitch from recesses 110b in the second column. Thus when the recesses 110 are viewed in the direction of the waveguide from the resonance surface 20, the recesses 110 in the even-numbered columns and the recesses 110 in the odd-numbered columns make contact with each other. As a result, leaking light propagating in the direction of the waveguide in the laser inevitably passes some of the recesses 110, thus increasing the efficiency of scattering the leaking light. When the recesses 110 are viewed in the direction of the waveguide from the resonance surface 20, it is more preferable that the recesses 110 in the even-numbered columns and the recesses 110 in the odd-numbered columns overlap each other. For that purpose, the distance between the recesses 110 (shortest distance between the peripheries of the recesses 110) may be set to be smaller than the diameter of the recess 110.

Figure 4B:
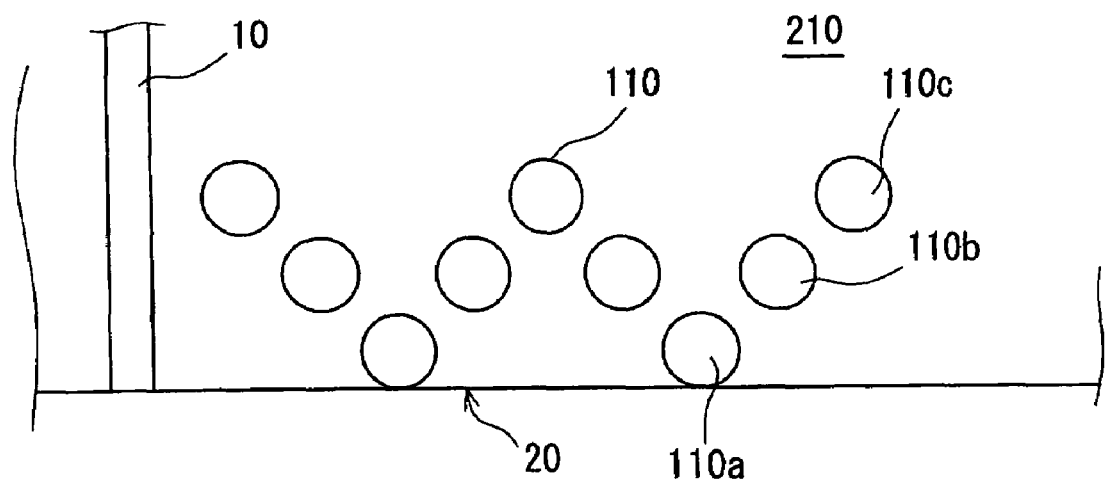
FIG. 4B is a schematic plan view showing another example of arranging the circular recesses.

In the example shown in FIG. 4B, the recesses having a circular shape 110 are arranged in a W-letter pattern. In this case, too, when the recesses 110 are viewed in the direction of the waveguide from the resonance surface, the recesses 110 in the odd-numbered columns and the recesses 110 in the even-numbered columns are located so as to make contact with or overlap each other. By arranging the recesses in W-letter pattern, it is made possible to scatter light effectively with a relatively small number of the recesses 110. The arrangement of the W-letter pattern shown in FIG. 4B may be repeated in two columns parallel to the waveguide. The arrangement of W-letter pattern shown in FIG. 4B may also be repeated in the direction perpendicular to the waveguide. A similar effect can be achieved by replacing the W-letter pattern with an M-letter pattern.

Figure 4C:
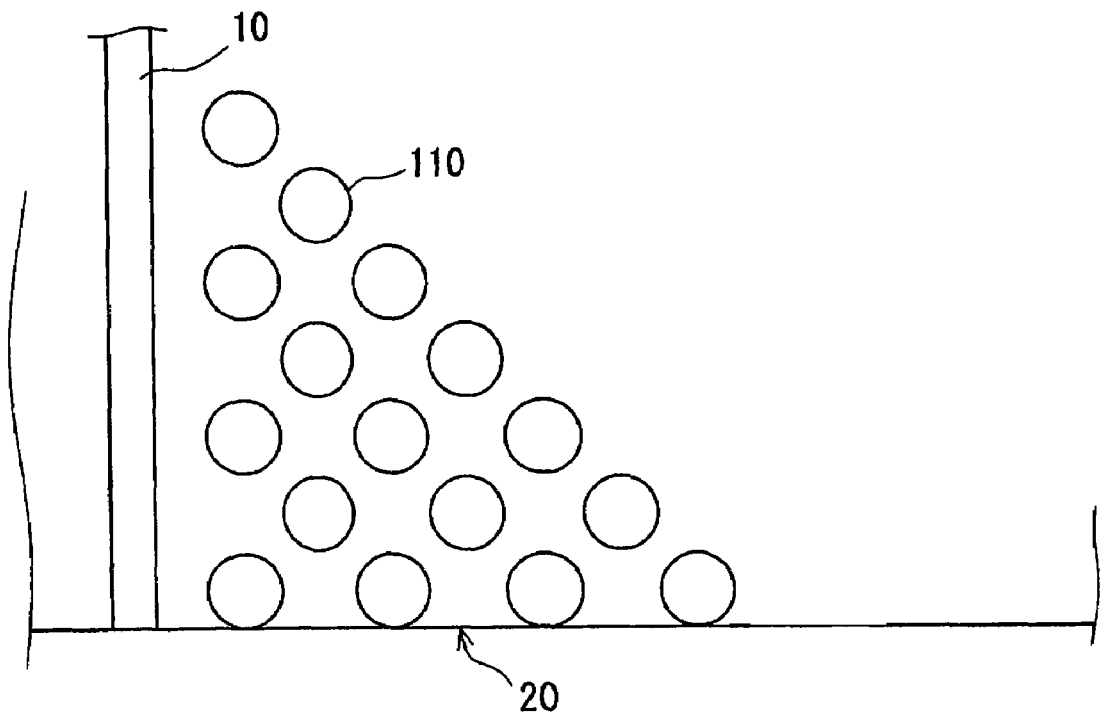
FIG. 4C is a schematic plan view showing a further example of arranging the circular recesses.
Figure 4D:
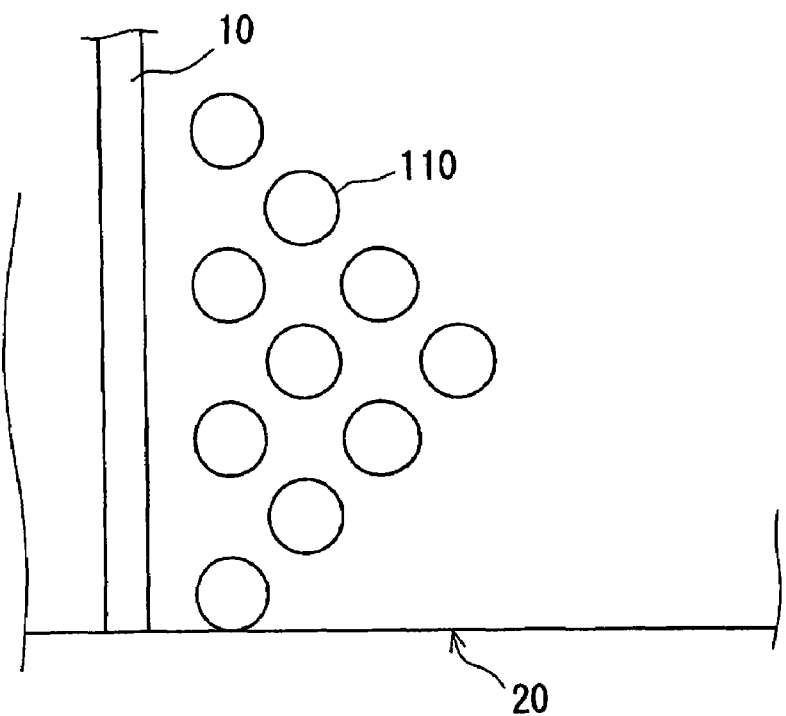
FIG. 4D is a schematic plan view showing an additional example of arranging the circular recesses.

In the example shown in FIG. 4C, the recesses having circular shape 110 are disposed repetitively in seven columns in the direction of the waveguide in a similar manner as shown in FIG. 4A. However, in the example shown in FIG. 4C, the number of recesses 110 included in one column perpendicular to the waveguide is gradually decreased with the distance from the resonance surface 20. The number of recesses 110 included in one column parallel to the waveguide is gradually decreased with the distance from the waveguide (namely the ridge 10). This enables it to improve the efficiency of scattering light in the vicinity of the end face of the resonator and in the vicinity of the waveguide which is particularly important. FIG. 4D is a variation of the pattern shown in FIG. 4C.

Figure 5A:
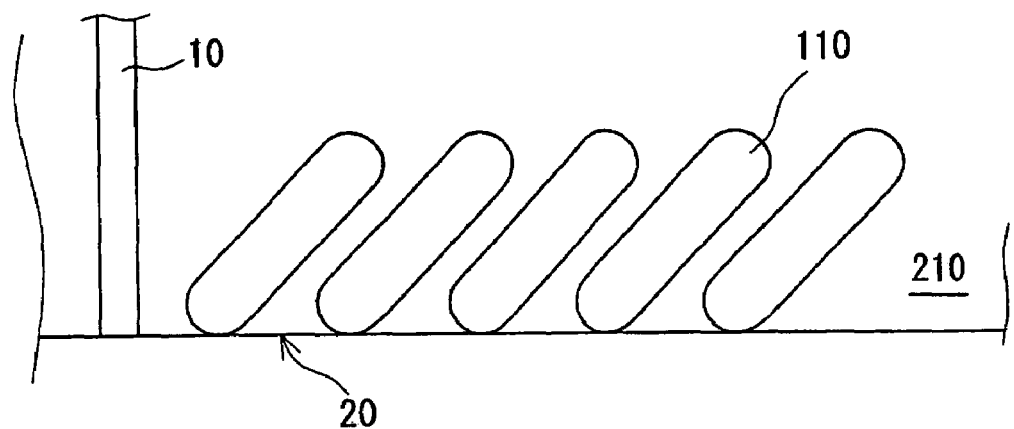
FIG. 5A is a schematic plan view showing an example of arranging one type of recess.
Figure 5B:
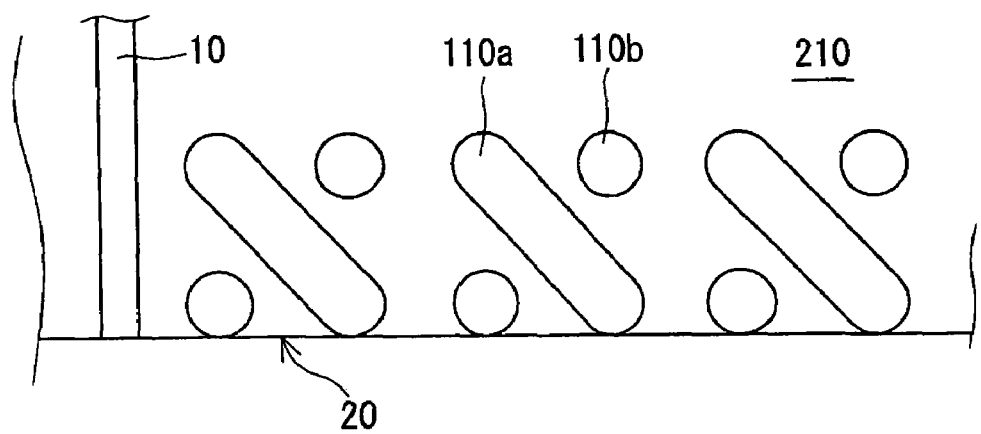
FIG. 5B is a schematic plan view showing another example of arranging two types of recesses.
Figure 5C:
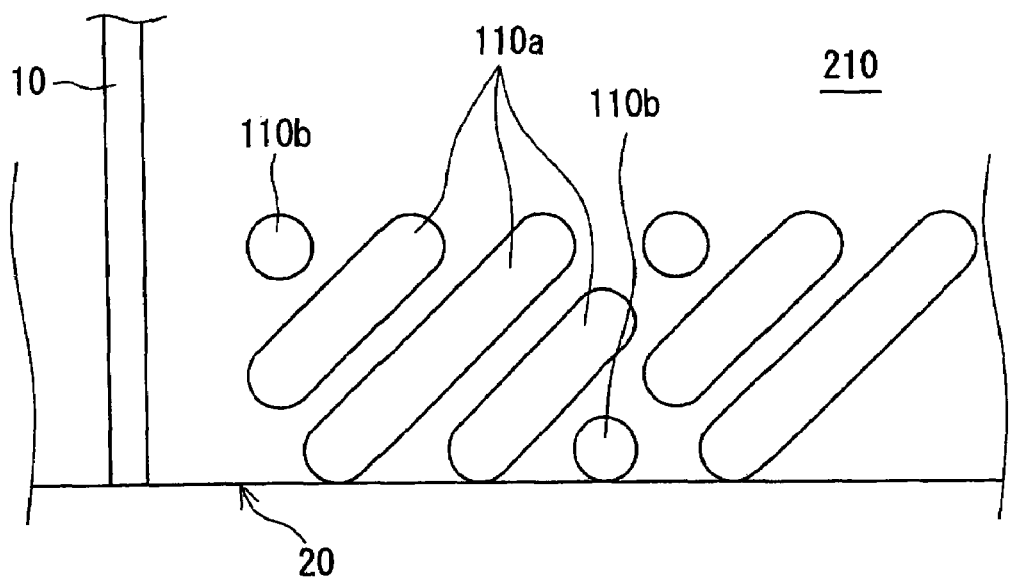
FIG. 5C is a schematic plan view showing another example of arranging various types of recesses.

FIGS. 5A through 5C show examples where some recesses 110 having a circular shape are disposed in succession so as to form the recesses 110 having a linear or bar shape in the plan view. In this case, it is preferable to form the recesses 110 to have a side inclined with respect to the light extracting end face 20 in the plan view. By disposing the side inclined with respect to the resonance surface, it is possible to deflect the light incident on the inclined side into a direction different from the direction of the main beam, thereby effectively suppressing ripples. In the example shown in FIG. 5A, a plurality of linear recesses 110 that are inclined from the light extracting end face 20 are disposed in the direction perpendicular to the waveguide. This configuration reduces the leaking light that passes between the recesses 110, and achieves a higher effect of suppressing ripples than in the case of disposing the recesses 110 with a simple circular shape. FIG. 5B and FIG. 5C show examples where linear recesses 110$a$ and circular recesses 110$b$ are combined.

Figure 6A:
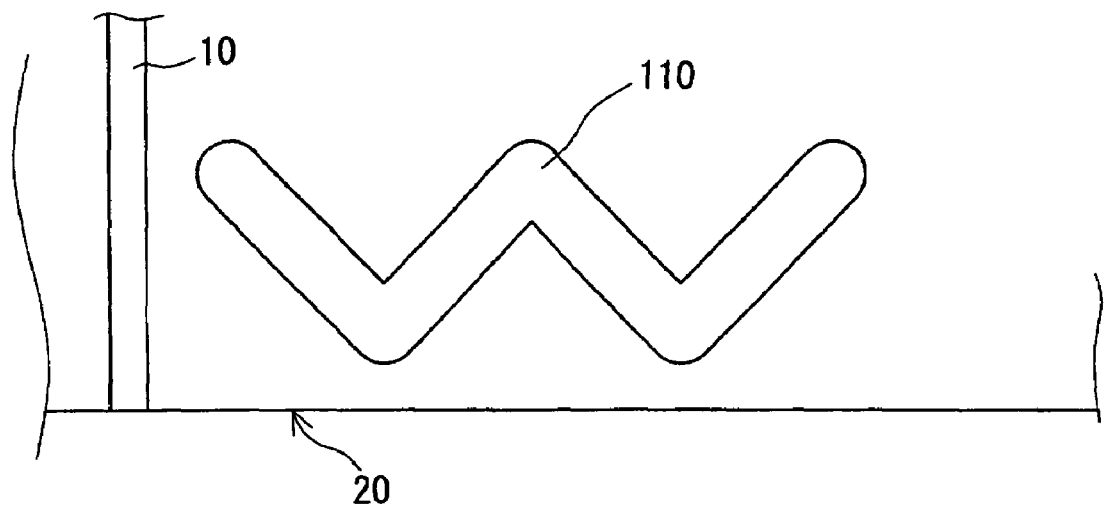
FIG. 6A is a schematic plan view showing an example of curvilinear recesses.
Figure 6B:
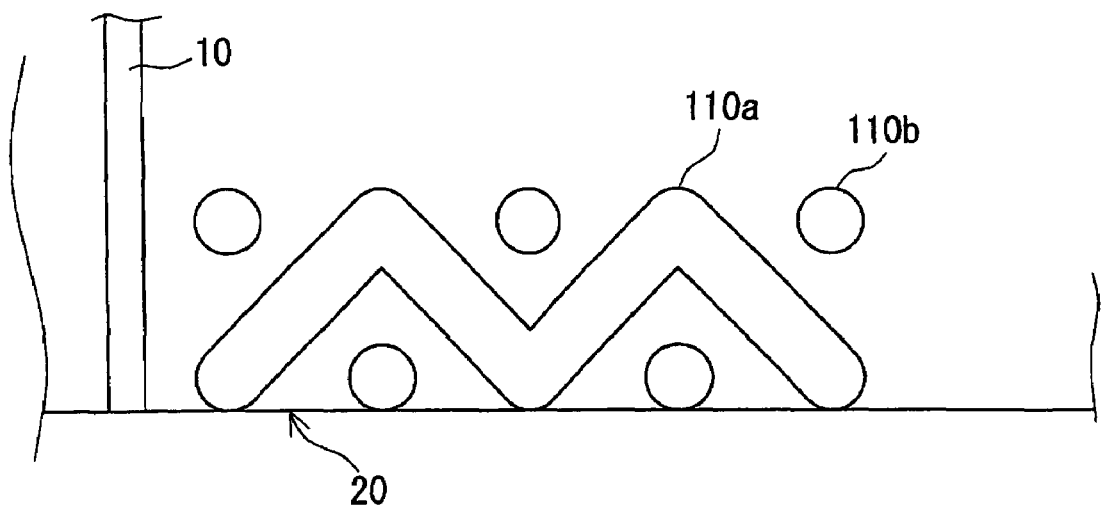
FIG. 6B is a schematic plan view showing another example of curvilinear recesses.

FIG. 6A and FIG. 6B show examples where linear recesses are connected. By connecting the recesses in this way, the gap between the recesses is eliminated so as to suppress light that leaks without being scattered or refracted. When linear recesses are connected, it is preferable to connect the linear recesses that are inclined in different directions alternately so as to form a zigzag line as shown in FIG. 6A and FIG. 6B (or a bending bar in a W-letter pattern in FIG. 6A and an M-letter pattern in FIG. 6B). When the recesses are formed in the W-letter or the M-letter pattern, the recess pattern comprises segments with different inclination angles from the resonance surface (the first segment and the second segment). The first segment and the second segment that are inclined at different angles are connected alternately to each other. With this configuration, since a larger number of inclined surfaces that refract light can be disposed in a limited area, ripples can be suppressed more effectively. Also the segments that are inclined at two different angles can refract leaking light into two different directions. As a result, leaking light that has been refracted can be prevented from being concentrated in a particular direction. In the example shown in FIG. 6B, circular recesses 110$b$ are combined with the recesses 110$a$ of an M-letter shape. In the example shown in FIG. 6C, a plurality of M-letter recesses are connected.

Such a linear pattern formed by connecting a plurality of recesses reduces the influence of the warping substrate. When the substrate is warped, light applied to form the recess tends to be out of focus on the wafer surface, resulting in variations in the size of the recesses. As a result, in the case of dot-shaped recesses 110 there arise portions where the gap between the recesses widens so that leaking light can pass without being scattered nor refracted. When the dot-shaped recesses are connected into a linear configuration, failure to focus the light applied to form the recess results only in a variation in the width of the recess without forming a wide gap through which leaking light can escape.

Figure 7A:
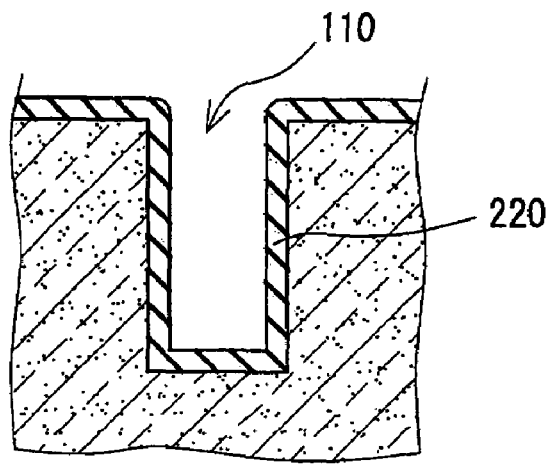
FIG. 7A is a schematic sectional view showing an example of the cross sectional shape of the recess.
Figure 7B:
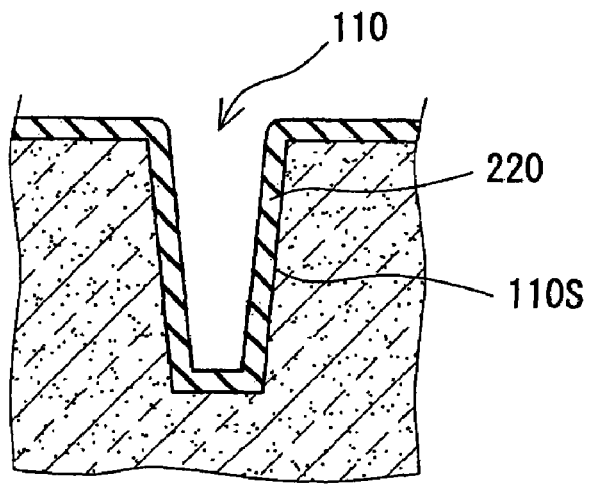
FIG. 7B is a schematic sectional view showing another example of the cross sectional shape of the recess.
Figure 7C:
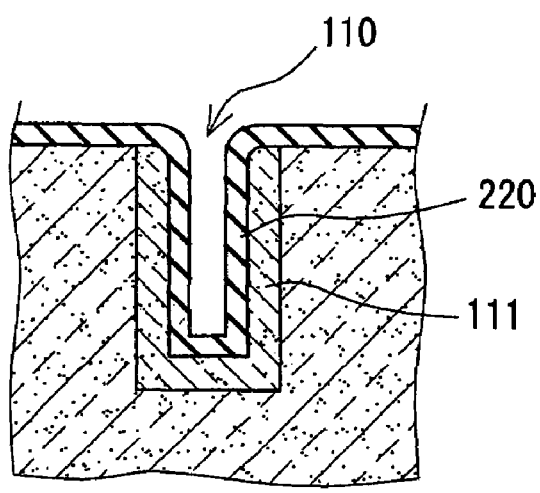
FIG. 7C is a schematic sectional view showing a further example of the cross sectional shape of the recess.

FIGS. 7A through 7C are schematic cross sectional views of the recess 110. While the cross section of the recess 110 may have side wall that is perpendicular to the principal surface of the substrate (not shown) as shown in FIG. 7A, the side wall 110$s$ is preferably inclined from the principal surface of the substrate as shown in FIG. 7B. When the side wall 110$s$ of the recess 110 is inclined from the principal surface of the substrate, light incident on the side wall 110$s$ of the recess 110 is more likely to be refracted according to the inclination of the side wall 110$s$ and propagate in a direction different from the direction of the main beam. That is leaking light can be deflected by the recess 110 not only in the X direction but also in the Y direction, thus suppressing ripples more effectively. The inner surface of the recess 110 in this embodiment is covered by a protective film 220 as shown in FIGS. 7A to 7C.

In the example shown in FIG. 7C, a light absorbing layer (embedded member) 111 is also formed on the inner wall of the recess 110. This enables it to scatter/refract the leaking light by the recess 110 while absorbing it at the same time, thus suppressing the influence of the leaking light more effectively. The light absorbing layer 111 formed on the inner wall of the recess 110 may be made of, for example, a semiconductor that has band gap narrower than that of the active layer. In the case of a GaN semiconductor that includes In that is used to form the active layer, the light absorbing layer 111 may be formed from a GaN semiconductor that includes In in higher proportion than in the active layer. By using a semiconductor based on the same material as that of the laser element, the semiconductor laser device can be prevented from being contaminated or subjected to strain caused by a difference in the expansion coefficient. The light absorbing layer 111 may also be formed from an InP semiconductor or a GaAs semiconductor. The light absorbing layer 111 may also be formed from a metal or oxide of a metal. For example, Ni, Cr, Ti, Cu, Fe, Zr, Hf, Nb, W, Rh, Ru, Mg, Si, Al, Sc, Y, Mo, Ta, Co, Pd, Ag, Au, Pt, In and oxide thereof (e.g. RhO) can be used. The light absorbing layer 111 can also be made of SiN, BN, SiC and AlN. SiN, BN, SiC and AlN are preferably amorphous.

In any of the cases shown in FIGS. 7A through 7C, it is preferable that the inside of the recess 110 is hollow. When the inside of the recess 110 is hollow, a significant difference is generated in the refractive index across the inner surface of the recess 110, resulting in an increased effect of the recess 110 to scatter and/or refract light. Therefore, even when the protective film 220 or the light absorbing layer 111 is formed on the inside of the recess 110, it has preferably such a thickness that does not completely fill in the recess 110. The light absorbing layer may completely fill in the recess 110 to make a flat surface. When the recess 110 is completely filled in to make flat surface, however, it is necessary to form the light absorbing layer 111 from a material having a different refractive index from that of the semiconductor, so that the effect of the recess 110 to scatter and/or refract light would not be lost.

The light absorbing layer 111 may be formed, for example, after forming the recess 110 and before removing a mask (resist pattern or the like) used in forming the recess 110. The light absorbing layer 111 may be formed by such a process as CVD, sputtering, vapor deposition or the like.

The recesses 110 may be formed by etching with the use of a mask. By controlling the etching conditions, the side face of the recess can be formed either perpendicular to or inclined from the surface. The recess may be formed in any desired planar shape, such as circle, triangle, hexagon or parallelogram by selecting the mask pattern accordingly.

The semiconductor layer 200 of the first conductivity type, the active layer 205 and the semiconductor layer 210 of the second conductivity type are all preferably made of a compound semiconductor. The semiconductor layer of the second conductivity type has a conductivity type different from the first conductivity type. If either one is an n-type semiconductor layer, the other becomes a p-type semiconductor layer. The active layer 205 is formed in a multiple quantum well structure or a single quantum well structure.

It is necessary that the semiconductor layer 210 of the second conductivity type has enough durability to allow the recesses 110 to be formed on the surface thereof. Therefore, it is preferable to suppress dislocations from propagating from the substrate 101 to the semiconductor layer 210 of the second conductivity type. Dislocations that have occurred again in the active layer 205 are also preferably suppressed from propagating to the semiconductor layer 210 of the second conductivity type. For this purpose, the substrate 101 and the semiconductor layers are preferably formed from compound semiconductors based on the same material.

Manufacturing Method

A method of manufacturing the semiconductor laser device of this embodiment will now be described below.

In this embodiment, a substrate that has a first principal surface and a second principal surface is used. The substrate has semiconductor layers stacked on the first principal surface and an electrode formed on the second principal surface. The semiconductor layers have a separate light confinement (SCH) structure where the active layer is sandwiched by the semiconductor layer of the first conductivity type and the semiconductor layer of the second conductivity type. This is for the purpose of forming the waveguide for light by providing, at position above and below the active layer, optical guide layers that have larger band gap than that of the active layer.

(1) Preparation of Substrate 101

First, the semiconductor layer is grown on the substrate 101. In this embodiment, the nitride semiconductor substrate 101 is used. The nitride semiconductor substrate 101 is preferably made of GaN, AlN, AlGaN, InAlGaN or the like that are compounds of nitrogen and group III elements B, Ga, Al, In, etc. The nitride semiconductor substrate 101 may include n-type impurity or p-type impurity.

The nitride semiconductor substrate may be made by various methods. For example, after growing a nitride semiconductor layer on a substrate of a material different from the nitride semiconductor, the substrate of the different material used as the base for growing is removed to thereby obtain the nitride semiconductor substrate. When growing a nitride semiconductor layer on a substrate of a different material, it is preferable to form the nitride semiconductor layer by a gas phase process such as MOCVD or HVPE. More specifically, a buffer layer made of a nitride semiconductor is grown on a substrate made of sapphire, SiC, GaAs or the like. The buffer layer is grown at a temperature not higher than 900° C. Then a film of a nitride semiconductor having a thickness of 50 μm or more is grown on the substrate of different material. Then the substrate with the different material is removed thereby to obtain the nitride semiconductor substrate. The substrate with the different material can be removed by polishing, grinding, CMP, etching, electromagnetic radiation, irradiation with laser beam or the like. It is preferable that the surface where the nitride semiconductor is grown is used as the first principal surface, and the surface of the nitride semiconductor substrate exposed by removing the substrate of different material is used as the second principal surface. It is preferable that the nitride semiconductor layer be grown preferably by an ELO or selective growth method, in order to suppress the occurrence of dislocations. The ELO method includes a process so that surface unevenness is formed on the substrate or the nitride semiconductor layer formed on the substrate, and the nitride semiconductor is grown thereon again. Instead of the process where the substrate with the different material is removed, a single crystal of nitride semiconductor may be formed in bulk by hydrothermal synthesis where a crystal is grown in a supercritical fluid, high-pressure process, flux method or the like.

The first principal surface of the nitride semiconductor substrate 101 preferably lies in the C plane, A plane or M plane. The first principal surface may also be, instead of a crystal growth plane such as the C plane, A plane or M plane, the (000-1) plane. The second principal surface of the substrate 101 preferably lies in the (000-1) plane. The second principal surface may include the (0001) plane. In this specification, the bar included in the notation of the crystal orientation in parentheses is to be placed over the figure that follows. There is no restriction on the shape of the nitride semiconductor substrate, which may be circular or rectangular.

The nitride semiconductor substrate 101 possibly has dislocations distributed periodically within the plane. When the ELO process is employed, for example, a region of low dislocation density and a region of high dislocation density are alternately formed. While the region of low dislocation density and the region of high dislocation density are formed preferably in a stripe pattern, they may also be formed in a pattern of dots. Stress generated inside of a nitride semiconductor substrate can be released, if dislocations are distributed periodically within the plane thereof. The nitride semiconductor device may be formed to a thickness of 5 μm or more without forming a stress relieving layer on the substrate. The number density of dislocations in a unit area of the region of low dislocation density is $1 \times 10^7/cm^2$ or less, and preferably $1 \times 10^6/cm^2$ or less. The region of high dislocation density is a region where the density of dislocations is higher than that of the region of low dislocation density. The dislocations can be measured by CL observation or TEM observation.

The nitride semiconductor substrate 101 may also have a first region that includes first n-type impurity and a second region that includes n-type impurity different from the first n-type impurity formed on the first principal surface thereof. The first region and the second region can be formed on the first principal surface of the nitride semiconductor substrate as follows. First, when making the nitride semiconductor substrate, the first region is formed by growing a nitride semiconductor while doping it with an n-type impurity. Then the second region is formed by injecting ions of an n-type impurity different from that of the first region into an area other than the first region, on the first principal surface of the substrate. Alternatively, the second region may also be formed by forming recesses in the surface of the nitride semiconductor substrate 101, then growing the nitride semiconductor again in the recess while doping with the n-type impurity different from that of the first region.

The nitride semiconductor substrate 101 may have an off-angle formed in the surface thereof. The off-angle is in a range from 0.02 to 90°, and preferably from 0.05 to 5°. Forming the off-angle in the surface of the nitride semiconductor substrate enables it to improve the quality of the crystal of the nitride semiconductor to be grown thereon. Alternatively, a new exposed surface may be formed by grinding the substrate surface by etching or the like after growing the nitride semiconductor substrate. This configuration may lower a driving voltage.

The concentration of the n-type impurity included in the nitride semiconductor substrate 101 is preferably in a range from $1\times10^{17}$ cm$^{-3}$ to $1\times10^{20}$ cm$^{-3}$. The thickness of the nitride semiconductor substrate is preferably in a range from 50 μm to 1 mm, and more preferably in the range from 50 μm to 500 μm. When the thickness is within this range, the substrate can be cleaved with good reproducibility after forming the semiconductor laser device. When the thickness of the nitride semiconductor substrate is less than 50 μm, it is difficult to handle in the device process.

Unevenness may be formed on the first principal surface and/or the second principal surface of the nitride semiconductor substrate 101 by applying wet etching, dry etching or CMP treatment to the substrate surface. The second principal surface is the face that is opposed to the first principal surface and is the plane for forming an electrode thereon. Dry etching processes include RIE (reactive ion etching), RIBE (reactive ion beam etching), ECR (electron cyclotron resonance), ICP (high-frequency induction coupled plasma), FIB (focused ion beam) and the like. The nitride semiconductor substrate having the crystal growing surface partially in a different plane is preferable in view of eliminating the stress and strain generated in the substrate. For example, the principal surface is mainly the (0001) plane and partly other crystal growing surfaces such as the (000-1) plane, the (11-20) plane, the (10-15) plane, the (10-14) plane or the (11-24) plane.

It is preferable that the nitride semiconductor substrate has at least two different crystal growth planes in the second principal surface from among the (000-1) plane, the (0001) plane, the (11-20) plane, the (10-15) plane, the (10-14) plane and the (11-24) plane. When a nitride semiconductor device is formed on such a nitride semiconductor substrate, stress is suppressed from developing in the device and therefore damage caused by cleaving can be endured.

The density of dislocations in the nitride semiconductor substrate is $1\times10^6$/cm$^2$ or less, and preferably $5\times10^5$/cm$^2$ or less. Service life of the device can be elongated by forming the ridge over the region having such a low density of dislocations to thereby provide the waveguide region. The X-ray rocking curve of the (0002) diffraction of the nitride semiconductor substrate measured by the biaxial crystal method has a full width at half maximum of 2 minutes or less, and preferably 1 minute or less.

(2) Growth of the Semiconductor Layer

In the construction of this embodiment, the semiconductor layer 200 of the first conductivity type is the n-type semiconductor layer and the semiconductor layer 210 of the second conductivity type is the p-type semiconductor layer. The nitride semiconductor substrate of this embodiment has the SCH (separate confinement heterostructure) where optical guide layers are formed on both sides of the active layer, with an n-side cladding layer and a p-side cladding layer further provided on both sides thereof. A nitride semiconductor layer having a low refractive index is provided for the cladding layer in order to confine light. The cladding layer has the effect of carrier confinement as well. A stress relieving layer may also be provided between the layers.

Specifically, the layers are grown in the following order.
(Semiconductor layer 200 of first conductivity type)

First, as the semiconductor layer 200 of the first conductivity type, an n-side cladding layer 203 made of $Al_xGa_{1-x}N$ ($0 \leq x \leq 0.5$) doped with n-type impurity and an n-side optical guide layer 204 made of $Al_xGa_{1-x}N$ ($0 \leq x \leq 0.3$) are grown. The n-side cladding layer 203 may consist of a single layer or multiple layers. In case the n-side cladding layer 203 is a single layer, the n-side cladding layer 203 preferably has composition represented by general formula of $Al_xGa_{1-x}N$ ($0 \leq x \leq 0.2$) and thickness in a range from 0.5 to 5 μm. In case the n-side cladding layer 203 has multi-layer structure, the n-side cladding layer preferably has super lattice structure. For example, the n-side cladding layer 203 may be constituted from a first layer made of $Al_xGa_{1-x}N$ ($0 \leq x \leq 0.1$) and a second layer made of $Al_yGa_{1-y}N$ ($0.01 \leq y \leq 1$). A low-temperature growth buffer layer, an intermediate layer and a crack prevention layer may also be provided between the n-side cladding layer 203 and the first principal surface of the substrate 101. A base layer may also be provided between the n-side cladding layer 203 and the first principal surface of the substrate 101. The base layer is preferably made of $Al_aGa_{1-a}N$ ($0 \leq a \leq 0.5$). This construction reduces dislocations (threading dislocations) and pits generated in the surface of the nitride semiconductor layer. The base layer may comprise a single layer or multiple layers.

Active Layer 205

Then a nitride semiconductor layer having a composition represented by the general formula of $In_xAl_yGa_{1-x-y}N$ ($0 < x \leq 1, 0 \leq y < 1, 0 < x+y \leq 1$) is preferably grown as the active layer 205. Increasing the proportion of Al in this general formula enables it to emit ultraviolet ray. The emission wavelength can be changed from 360 nm to 580 nm by controlling the composition. The efficiency of the light emission can be improved by forming the active layer 205 in a quantum well structure. The proportion of In in the composition of the well layer is preferably in a range of $0 < x \leq 0.5$. It is preferable that thickness of the well layer is in a range from 30 to 200 Å, and thickness of the barrier layer is in a range from 50 to 300 Å. The multiple quantum well structure of the active layer may start with one of the barrier layers and end with one of the well layers, start with a barrier layer and end with a barrier layer, start with a well layer and end with a barrier layer, or start with a well layer and end with a well layer. A preferable construction is such that they start with a barrier layer, comprising a pair of the well layer and the barrier layer repeated two to eight times and ends with a barrier layer. By repeating the pair of the well layer and the barrier layer two or three times, the threshold can be decreased and the service life can be elongated.

Semiconductor Layer 210 of the Second Conductivity Type

Then as the semiconductor layer 210 of the second conductivity type, a p-side electron confinement layer 206 made of $Al_xGa_{1-x}N$ ($0 \leq x \leq 0.5$) doped with a p-side impurity, a p-side optical guide layer 207 made of $Al_xGa_{1-x}N$ ($0 \leq x \leq 0.3$), a p-side cladding layer 208 made of $Al_xGa_{1-x}N$ ($0 \leq x \leq 0.5$) doped with p-type impurity and a p-side contact layer 209 made of $Al_xGa_{1-x}N$ ($0 \leq x \leq 1$) doped with p-type impurity are formed. The p-side electron confinement layer 206 may be omitted.

The semiconductor layers included in the semiconductor layer of the first conductivity type 200 and in the semiconductor layer of second conductivity type 210 may comprise a mixed crystal that includes In.

The n-side cladding layer 203 and the p-side cladding layer 208 may be formed in a single layer structure, a double-layer structure or a super lattice structure comprising two layers of different compositions. The total thickness of the n-side and the total thickness of the p-side cladding layers is preferably in a range from 0.4 to 10 μm, respectively. When the thickness is within this range, the forward voltage (Vf) can be reduced. A mean proportion of Al in the entire cladding layers is in a range from 0.02 to 0.1. Values in this range are advantageous for suppressing the occurrence of cracks and creating differences in the refracting index with the waveguide.

An impurity is preferably added to a concentration in a range from $5\times10^{16}/cm^3$ or to $1\times10^{21}/cm^3$. An impurity concentration higher than $1\times10^{21}/cm^3$ leads to poor crystallinity of the nitride semiconductor layer, which may result in low output power. This applies also to modulation doping. In the case of an n-type impurity, in particular, the impurity concentration is preferably in a range from $1\times10^{17}/cm^3$ or to $5\times10^{19}/cm^3$. The concentration of the n-type impurity in this range decreases resistivity without compromising the crystallinity. In the case of a p-type impurity, in particular, the impurity concentration is preferably in a range from $1\times10^{19}/cm^3$ to $1\times10^{21}/cm^3$. The concentration of the p-type impurity in this range does not compromise the crystallinity. The n-type impurity may be Si, Ge, Sn, S, O, Ti, Zr, Cd or the like. The p-type impurity may be Be, Zn, Mn, Ca, Sr or the like, in addition to Mg. The substrate and the nitride semiconductor layer are grown by vapor phase growing process such as metalorganic chemical vapor deposition (MOCVD), halide vapor phase epitaxy (HVPE) or molecular beam epitaxy (MBE).

(3) Exposing the N-Side Semiconductor Layer 200 by Etching

A wafer having the n-side semiconductor layer 200, the active layer 205 and the p-side semiconductor layer 210 formed one on another on the nitride semiconductor substrate 101 is taken out of a semiconductor growing apparatus. In order to relieve stress, the p-side semiconductor layer 210, the active layer 205 and the n-side semiconductor layer 200 are partially etched at a position corresponding to the side face of the laser element, so as to partially expose the n-side semiconductor layer 200. While there is no restriction on the surface where the n-side semiconductor layer 200 is exposed, the n-side cladding layer 203 is taken in this embodiment. Etching may be carried out by an RIE process using $Cl_2$, $CCl_4$, $BCl_3$, $SiCl_4$ gas or the like.

(4) Formation of the Waveguide

Then the waveguide region with a stripe shape is formed in the p-side semiconductor layer 210. A protective film is formed from $SiO_2$ or the like on the surface of the p-side contact layer 209 that is the topmost layer of the p-side semiconductor layer 210. The protective film is patterned so as to form the waveguide region with the stripe shape. The protective film may be patterned by means of photolithography. First, the photoresist is coated on the $SiO_2$ layer. Then, the photoresist layer is exposed with a projection-exposure apparatus. Short-wavelength light of 400 nm or less is preferable for the exposure light source. If exposed with light in an ultraviolet region under 400 nm, more preferably under 370 nm, the nitride-semiconductor substrate 101 can absorb the light. Thus, random reflection at the back surface of the substrate 101 is suppressed, and a patterned shape will be more precise.

This method is not limited to forming ridge but also applicable for any patterning process. Using the patterned photoresist layer as a patterning mask, $SiO_2$ is patterned into a stripe shape. Then, using the patterned $SiO_2$ as a mask, the p-side semiconductor layer 210 is etched in the region other than that corresponding to the waveguide region of the stripe shape. Etching is preferably carried out by an RIE process using a chlorine-based gas such as $Cl_2$, $CCl_4$, $SiCl_4$, $BCl_3$. The width of the ridge 10 that serves as the waveguide region is preferably in range from 1.0 μm to 50.0 μm. The length of the waveguide region in the direction of stripe is preferably in range from 300 μm to 1000 μm. In the case of a single mode laser, the width of the ridge 10 is preferably made narrower in the range from 1.0 μm to 2.0 μm. When the ridge width is 10 μm or larger, a high output power of 200 mW or more can be achieved. The height of the ridge 10 (depth of etching) is set to such a value that exposes the p-side cladding layer 208 in this embodiment. When a large current is drawn, the current tends to spread laterally below the ridge 10, and therefore the ridge is preferably formed by deep etching. For example, the ridge is preferably formed by etching to such a depth where the p-side optical guide layer 207 is exposed.

(5) Formation of the Recesses

After forming the ridge 10 that serves as the waveguide region with the stripe shape, the recesses 110 are formed in the surface of the p-side semiconductor layer 210. The recesses 110 are formed at positions located away from the ridge 10 that defines the waveguide region. The distance of the recesses 110 from the end of the ridge 10 is 0.1 μm or more, and preferably 0.5 μm or more.

First, a resist pattern having a plurality of openings is formed at a position near the light extracting end face 20 and away from the ridge 10, by a photolithography technique. The openings in the resist pattern define the planar configuration of the recesses 110. The thickness of the resist pattern may be such that enables it to etch the semiconductor layer.

Then the semiconductor layer is etched in order to form the recesses 110. The depth of etching determines the depth of the recesses. The depth of etching is preferably such that it reaches the n-side semiconductor layer 200. The depth of etching is preferably in a range from 0.1 μm to 3 μm. Then the resist pattern is removed using a release liquid.

The recesses 110 may also be formed simultaneously with the process of exposing the n-side layer 200 in the process (3) described above. In this case, the bottom of the recess 110 and the exposed surface 203a of the n-side layer 200 become the same in height. By forming the recesses 110 simultaneously with the process of exposing the n-side layer 200, the yield of production of the semiconductor laser device is improved and its characteristics are stabilized.

Specifically, in the method described in this embodiment, etching is carried out three times; when exposing the n-side semiconductor layer in process (3), when forming the waveguide in process (4) and when forming the recesses in process (5). This means that mask alignment for the etching operation is carried out three times, thus giving rise to the possibility of defects caused by misalignment of the mask and variability in the device characteristics. When the operations of exposing the n-side semiconductor layer in process (3) and formation of the recesses in process (5) are carried out at the same time, the number of mask alignment operations is reduced, and the possibility of defects caused by misalignment of the mask and variability in device characteristics can be reduced.

(6) Formation of the Insulation Film 220

Then the side face of the ridge is protected with an insulation film 220. The insulation film 220 is made of an insulating material that has refractive index lower than that of the semiconductor layer, such as $ZrO_2$, $SiO_2$ or an oxide of V, Nb, Hf, Ta or the like. The insulation film 220 is preferably formed also in the region where the recesses 110 are formed. By doing so, the n-side semiconductor layer 200 that is exposed on the inside of the recesses 110 can be prevented from short-circuiting with the p electrode 230.

(7) Formation of the p Electrode 230

After protecting the side face of the ridge 10 with the insulation film (embedding film) 220, the p electrode 230 is formed on the surface of the p-side contact layer 209. Preferably, the p electrode 230 is formed on the p-side contact layer 209 and on the insulating layer 220. The p electrode 230 is preferably formed in a multi-layer structure such as a double layer structure consisting of Ni and Au. Ni film having a thickness of 50 to 200 Å is formed on the p-side contact layer 209, and then a Au film having thickness of 500 to 3000 Å is formed. When the p electrode 230 is formed in a 3-layer structure, it may be formed in such a construction as Ni/Au/Pt, Ni/Au/Pd or the like. In such a 3-layer structure, it is preferable to form the Ni film to a thickness of 50 to 200 Å, Au film to a thickness of 500 to 3000 Å, and the last layer of Pt or Pd to a thickness of 500 to 5000 Å.

After forming the p electrode 230, ohmic annealing is carried out at a temperature of 300° C. or higher, and preferably 500° C. or higher, in an atmosphere that includes nitrogen and/or oxygen.

(8) Formation of the Protective Film 240 and the p Pad Electrode 250

Then the protective film 240 is formed on the side face of the n-side semiconductor layer 200 that has been exposed in the previous process, followed by the formation of the pad electrode 250 on the p electrode 230. The pad electrode 250 is preferably formed by stacking metals such as Ni, Ti, Au, Pt, Pd, W, etc. For example, the pad electrode 250 preferably comprises W/Pd/Au or Ni/Ti/Au stacked in this order from the p electrode side. While there is no restriction on the thickness of the pad electrode 250, the thickness of the last layer made of Au is preferably 1000 Å or larger.

(9) Formation of the n Electrode 232

An n electrode 232 is formed on the second principal surface of the nitride semiconductor substrate 101. The n electrode 232 may be formed by CVD, sputtering, vapor deposition or other process. The n electrode 232 preferably includes one element selected from among a group consisting of Ti, Ni, Au, Pt, Al, Pd, W, Rh, Ag, Mo, V and Hf. The n electrode 232 may also be formed in a multi-layer structure having Pt or Au at the top layer, which improves the heat dissipation from the n electrode 232. Proper selection of these materials enables it to achieve good ohmic characteristic with the substrate 101 that is made of the nitride semiconductor. Also because adhesion between the substrate 101 made of the nitride semiconductor and the n electrode 232 is improved, the n electrode 232 is less to exfoliate during the cleaving process for dividing the wafer into bars or chips. The thickness of the n electrode 232 is 10000 Å or less, and preferably 6000 Å or less.

When the n electrode 232 is formed in a multi-layer structure, the first layer is preferably made of V, Ti, Mo, W, Hf or the like. The thickness of the first layer is 500 Å or less. In case the first layer is formed from W, a good ohmic characteristic is obtained when the thickness is set to 300 Å or less. Forming the first layer from V improves heat resistance. When the thickness of the V layer is in a range from 50 Å to 300 Å, and preferably from 70 Å to 200 Å, a good ohmic characteristic is obtained.

In case the n electrode 232 is formed from Ti/Al, thickness is preferably 10000 Å or less, for example, 100 Å/5000 Å. In case the n electrode 232 is formed from Ti/Pt/Au stacked in this order from the substrate side, the thickness is preferably 60 Å/1000 Å/3000 Å. For the other n electrode, a construction of Ti/Mo/Pt/Au stacked in this order from the substrate side may be employed, in which case the thickness is Ti (60 Å)/Mo (500 Å)/Pt (1000 Å)/Au (2100 Å). In case the n electrode has a construction of Ti/Hf/Pt/Au, for example, thickness is Ti (60 Å)/Hf (60 Å)/Pt (1000 Å)/Au (3000 Å). In case the n electrode has a construction of Ti/Mo/Ti/Pt/Au, the thickness is Ti (60 Å)/Mo (500 Å)/Ti (500 Å)/Pt (1000 Å)/Au (2100 Å). Such a construction may also be employed as W/Pt/Au, W/Al/W/Au, or Hf/Al, Ti/W/Pt/Au, Ti/Pd/Pt/Au, Pd/Pt/Au, Ti/W/Ti/Pt/Au, Mo/Pt/Au, Mo/Ti/Pt/Au, W/Pt/Au, V/Pt/Au, V/Mo/Pt/Au, V/W/Pt/Au, Cr/Pt/Au, Cr/Mo/Pt/Au, Cr/W/Pt/Au or the like, stacked in this order from the substrate side. The n electrode may be annealed at a temperature of 300° C. or higher after being formed.

The n electrode 232 of this embodiment is formed in a rectangular shape. The n electrode 232 is formed on the second principal surface of the substrate 101 in an area excluding the region where scribe lines are drawn for the purpose of cleaving the nitride semiconductor substrate into bars. It becomes easier to scribe and cleave when a metalizing electrode (which may be omitted) is formed on the n electrode in the same pattern as the n electrode. The metalizing electrode may have a construction such as Ti/Pt/Au/(Au/Sn), Ti/Pt/Au/(Au/Si), Ti/Pt/Au/(Au/Ge), Ti/Pt/Au/In, Au/Sn, In, Au/Si, Au/Ge or the like. Here the parentheses mean that metals inside the parentheses form eutectic alloys.

Before forming the n electrode 232, a step may be formed in the second principal surface of the nitride semiconductor substrate 101, which improves the ohmic characteristic and the adhesion of the n electrode 232. When the second principal surface lies in the (000-1) plane, an inclined surface other than the (000-1) plane can be exposed by the forming step. The inclined surface is not limited to one crystal orientation, and may have a plurality of orientations such as (10-15), (10-14), (11-24), etc. The proportion of the inclined surface is preferably 0.5% or more, and more preferably from 1% to 20% of the surface area of the surface that shows the N polarity. The height of the step is preferably 0.1 µm or larger. The step may have a tapered shape or an inversely tapered shape. A planar configuration of the step may be a stripe, a grid, an island, circular, polygonal, rectangular, comb, mesh or the like. Such a planar configuration may be formed either as a protrusion or a recess. In case a circular protrusion is formed, for example, the diameter of the circular protrusion is preferably 5 µm or larger. It is preferable to form a groove having a width of 3 µm or larger, since the n electrode 232 becomes less likely to peel off. Inclined surfaces other than the (000-1) plane can be exposed by forming with an off-angle in a range from 0.2 to 90°. When the second principal surface of the nitride semiconductor substrate has an inclined surface other than the (000-1) plane in addition to the (000-1) plane, the ohmic characteristic of the n electrode 232 is improved. As a result, the semiconductor laser device can have a high reliability.

(10) Formation of the Resonance Surface

After forming the n electrode 232, the wafer is divided into bars along a direction perpendicular to the p electrode 230 with the stripe shape to thereby form the resonance surface. The resonance surface is preferably in the M plane (1-100) or the A plane (11-20). The wafer may be divided into bars by blade breaking, roller breaking, press breaking or the like.

The wafer used in manufacturing the semiconductor laser device of this embodiment is preferably divided in the following two steps. This makes it possible to form the resonance surface with a high yield of production.

1) First, a cleavage assisting line is scribed on the first principal surface or the second principal surface of the nitride semiconductor substrate. The cleavage assisting line is formed across the entire width of the bar, or at positions that correspond to both ends of each device in the bar. Preferably, the cleavage assisting grooves are formed at intervals like a dashed line in the direction of cleaving for forming the bar. This enables it to restrict the cleaving direction from bending.

2) Then the wafer is divided into bars. The wafer may be divided into bars by blade breaking, roller breaking, press breaking or the like. The n electrode is formed over a part or entire surface of the second principal surface of the semiconductor substrate.

When the cleavage assisting grooves are formed on the first principal surface and/or the second principal surface of the nitride semiconductor substrate, the wafer can be easily cleaved into bars. Such an effect can also be obtained as preventing peel-off of the electrode formed on the second principal surface (back surface) of the nitride semiconductor substrate 101.

A reflector mirror may be formed on the resonance surface that has been formed by cleaving. The reflector mirror is a multi-layer film of a dielectric material made of $SiO_2$, $ZrO_2$, $TiO_2$, $Al_2O_3$, $Nb_2O_5$ or the like. The reflector mirror may be formed on the light reflecting side and/or the light extracting side of the resonance surface. The reflector mirror is preferably formed on both the light reflecting side and the light extracting side. If the resonance surface is formed by cleaving, the reflector mirror can be formed with good reproducibility.

(11) Dividing the Chips

The nitride semiconductor substrate divided into bars is further divided along a direction perpendicular to the stripe direction of the electrode, so as to divide it into chips of the semiconductor laser device. The semiconductor laser device formed in chips have rectangular shapes, the resonance surface of the rectangular shape is 500 μm or less, and preferably 400 μm or less in width.

The semiconductor laser device obtained as described above has a FFP with suppressed ripples, long life and other properties. A semiconductor laser device having an opposing electrode structure with contact resistivity of $1.0 \times 10^{-3}$ $\Omega cm^2$ or less can be made. The present invention can also be applied to a semiconductor laser device having a plurality of waveguide regions formed on a nitride semiconductor substrate and to a semiconductor laser device having a wide ridge.

Embodiment 2

This embodiment makes it easier to cleave a wafer when forming the resonance surface by dividing the wafer into bars. The semiconductor laser of the present invention is similar to the semiconductor laser of the first embodiment except for the points described below.

Figure 8A:
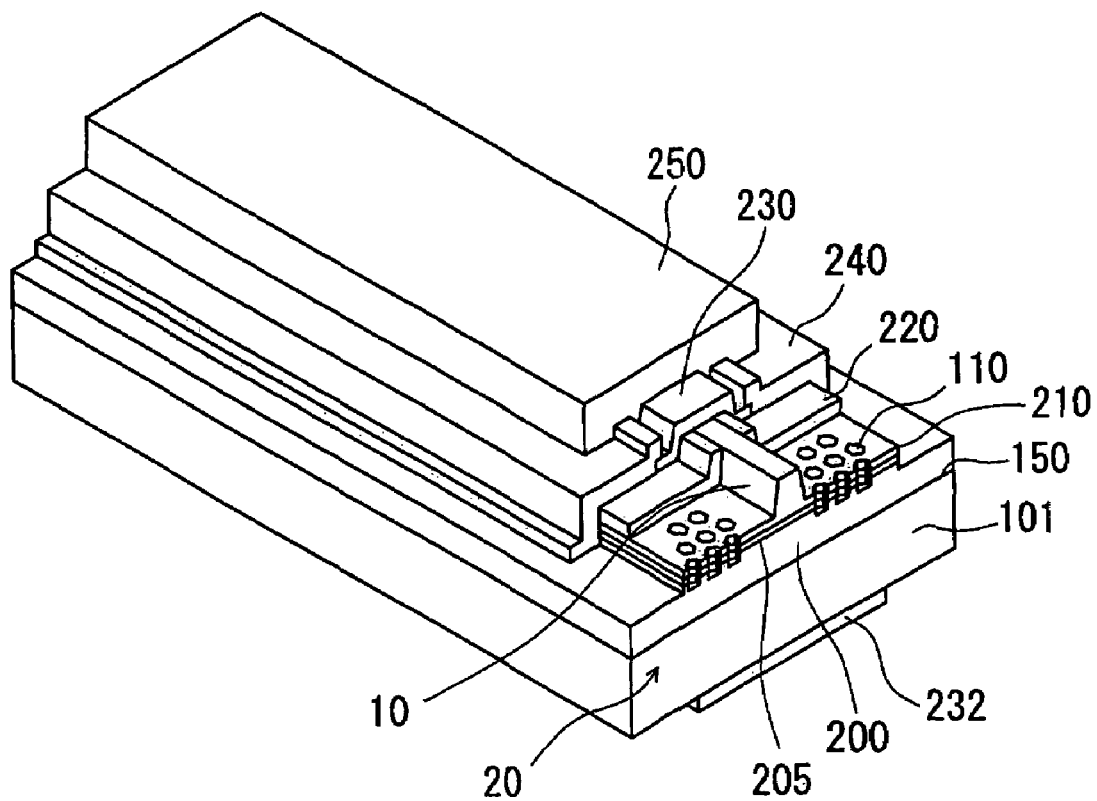
FIG. 8A is a schematic perspective view of a semiconductor laser device according to a second embodiment of the present invention.
Figure 8B:
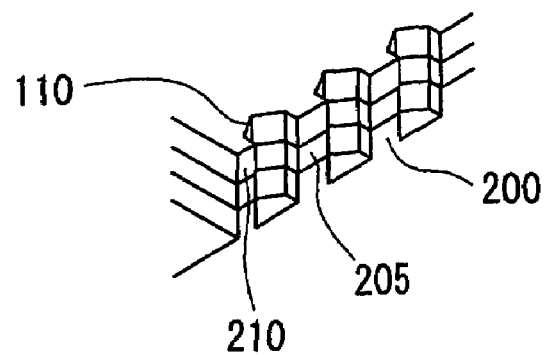
FIG. 8B is a partially enlarged perspective view of the semiconductor laser device according to the second embodiment in the vicinity of the recesses.

FIG. 8A is a perspective view of the semiconductor laser device of the second embodiment, and FIG. 8B is a partially enlarged perspective view of the recesses 110 shown in FIG. 8A. As shown in FIG. 8A and FIG. 8B, the semiconductor laser device of this embodiment has the arrangement of the recesses 110 so they overlap with the resonance surface 20, thereby having a notch formed in the resonance surface 20. This allows the recesses 110 that overlap the resonance surface 20 to function also as a cleavage assisting groove that assist to cleave the resonance surface 20, thus suppressing the occurrence of such a defect as deflection of the direction of cleaving.

In this embodiment, too, the recesses 110 can be formed in various planar shapes and arrangements. FIGS. 9A through 9D are plan views showing variations of the recesses 110 of this embodiment. In any of the embodiments, the recesses 110 are formed in such a construction that at least part of the recesses 110 overlap (or makes contact or intersect) with the light extracting end face 20. It is not necessary that all of the plurality of the recesses 110 overlap with the light extracting end face 20, but part of the recesses 110 may overlap with the light extracting end face 20.

Figure 9A:
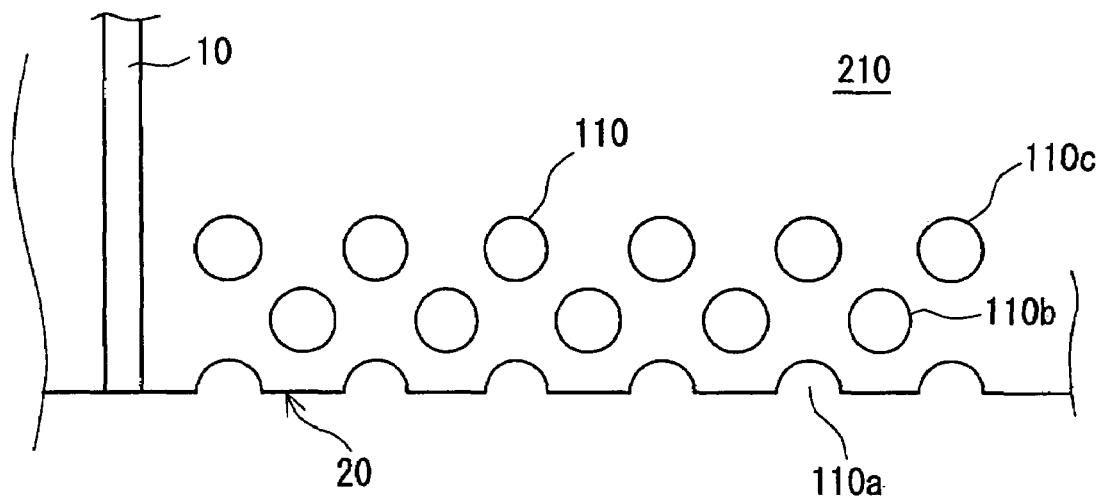
FIG. 9A is a schematic plan view showing an example of the configuration of the recess in the semiconductor laser device according to the second embodiment.

In the example shown in FIG. 9A, the recesses 110 are formed similarly to FIG. 4A. Specifically, the recesses 110 are disposed at equal intervals in the direction perpendicular to the ridge 10, and the arrangement of the recesses 110 is repeated in three columns parallel to the ridge 10. The recesses 110b in the second column are disposed at positions displaced by half of the pitch in relation to the recesses 110a in the first column, and the recesses 110c in the third column are disposed at positions displaced by half of the pitch in relation to the recesses 110b in the second column. In the example shown in FIG. 9A, the recesses 110a in the first column overlap the light extracting end face 20 in a semi-circular configuration, unlike that shown in FIG. 4A. As a result, a notch having the shape of a half of cylinder is formed in the light extracting end face 20, thus making it easier to cleave. That is, the recesses 110a in the first column functions as the cleavage assisting groove while preventing ripples by scattering and/or refracting light at the same time.

Figure 9B:
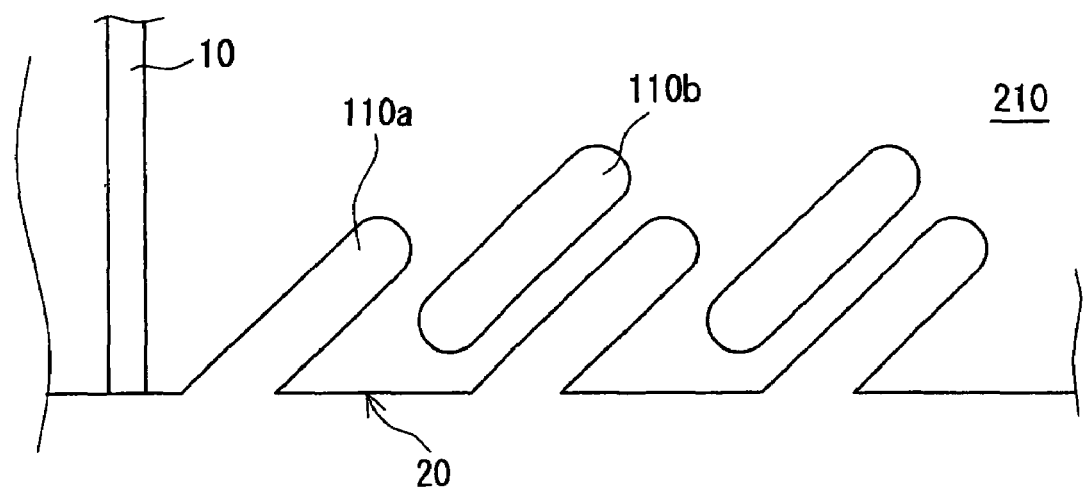
FIG. 9B is a schematic plan view showing an example of the configuration of the recess in the semiconductor laser device according to the second embodiment.

In the example shown in FIG. 9B, a plurality of recesses 110 having a linear shape in a planar configuration are formed obliquely in the light extracting end face and are disposed at equal intervals in the direction perpendicular to the ridge 10, similar to the example shown in FIG. 5A. The recesses 110 are disposed at staggered positions, and odd-numbered recess 110, as counted from the ridge 10 side, overlap with the light extracting end face 20. With this configuration, the odd-numbered recess 110 functions as the cleavage assisting groove.

Figure 9C:
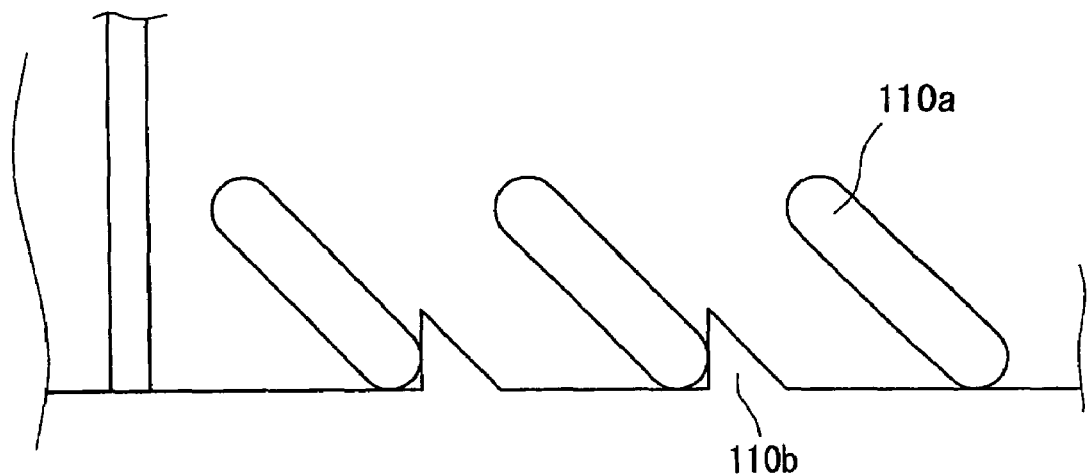
FIG. 9C is a schematic plan view showing an example of the configuration of the recess in the semiconductor laser device according to the second embodiment.

In the example shown in FIG. 9C, a plurality of recesses 110a having a linear shape in a planar configuration are formed obliquely in the light extracting end face and are disposed at equal intervals in the direction perpendicular to the ridge 10, with a recess 110b having triangular shape in a planar configuration being disposed between two linear recesses 110a. The triangular recess 110b has a side that is parallel to the light extracting end face and touches the light extracting end face. The triangular recess 110b functions as the cleavage assisting groove. That is, forming the triangular recess 110b so as to touch the light extracting end face results in the formation of a notch having the shape of triangular prism in the light extracting end face, thus making it easier to cleave.

Figure 9D:
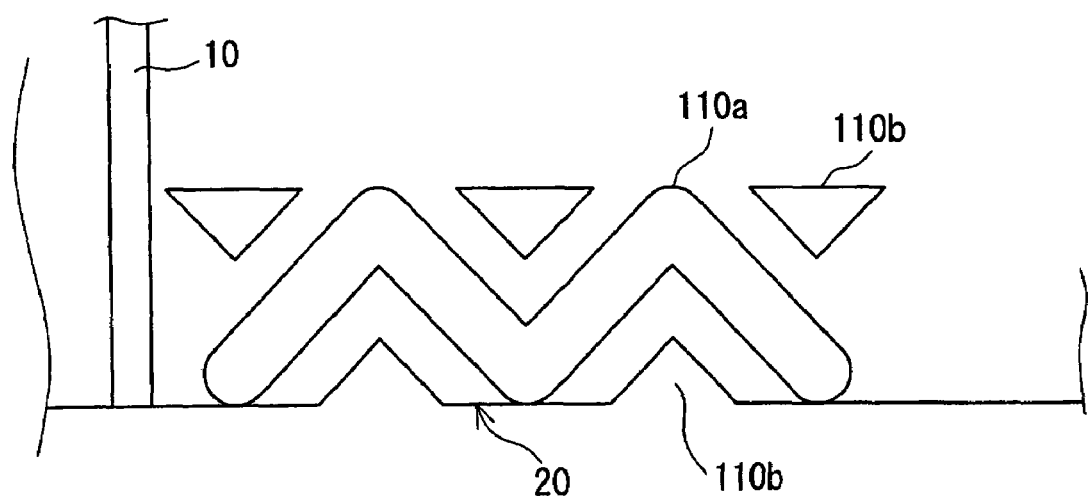
FIG. 9D is a schematic plan view showing an example of the configuration of the recess in the semiconductor laser device according to the second embodiment.

The embodiment of FIG. 9D is similar to that of FIG. 6B and the recesses 110a are formed so as to have an M-letter planar shape. Also, the recesses 110b having a triangle shape are formed so as to sandwich each linear part of the M-letter. The triangle recesses 110b have a side that is parallel to the extracting end face and touches the extracting end face. The triangle recesses 110b functions as a cleaving assisting groove. That is, when the triangle recesses 110b are formed so that their sides touch the extracting end face, notches having the shape of triangular prisms are formed in the light extracting end face, thus making it easier to cleave.

Figure 10A:
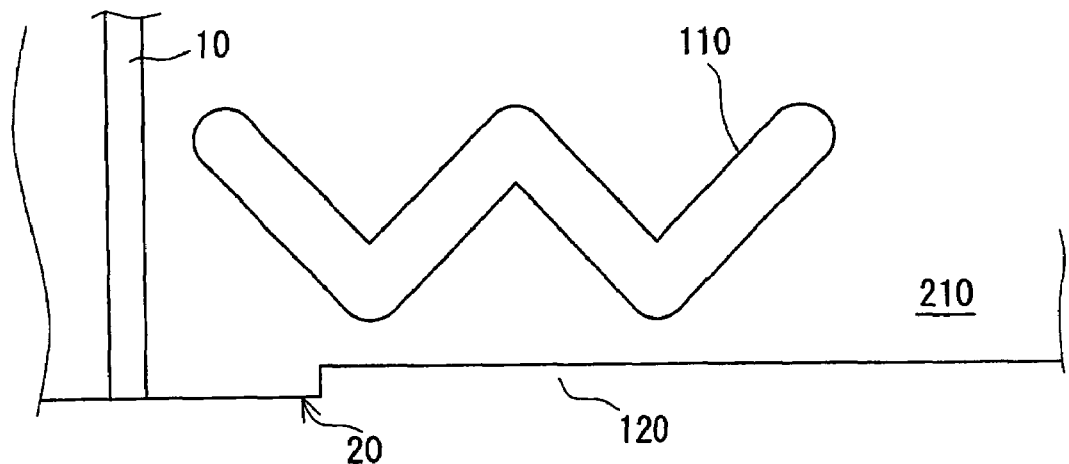
FIG. 10A is a schematic plan view showing an example of the configuration of the recesses and a cleaving assisting groove in the semiconductor laser device according to the second embodiment.

Apart from the recesses 110, a cleavage assisting groove 120 may be formed. As shown in FIG. 10A, for example, the cleavage assisting groove of a substantially rectangular shape 120 may be formed along the light extracting end face 20 besides the recess 110 having a W-letter shape. The cleavage assisting groove 120 is preferably formed at a distance of 0.1 µm or more, and more preferably 0.5 µm or more from the waveguide, in order to avoid damaging the crystal of the waveguide.

Figure 10B:
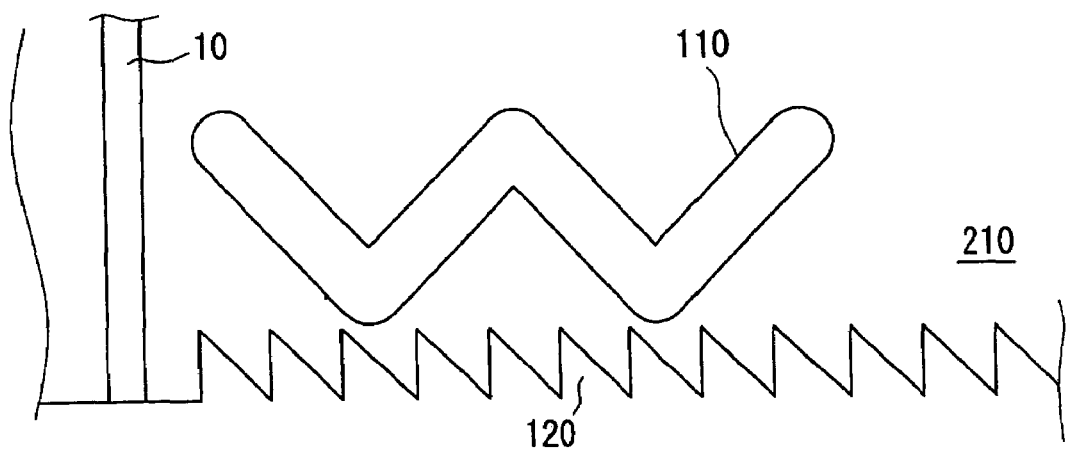
FIG. 10B is a schematic plan view showing an example of the planar configuration of the recess and the cleaving assisting groove in the semiconductor laser device according to the second embodiment.
Figure 10C:
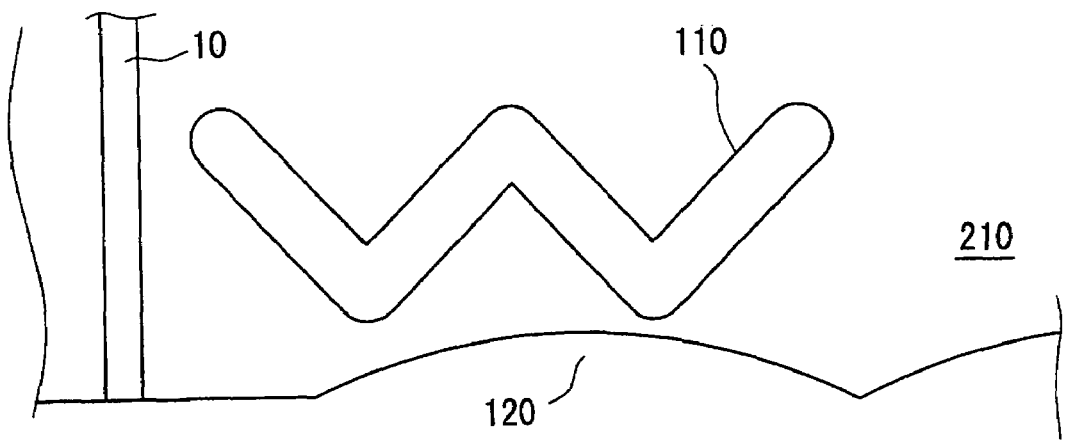
FIG. 10C is a schematic plan view showing an example of the configuration of the recess and the cleaving assisting groove in the semiconductor laser device according to the second embodiment.
Figure 11:
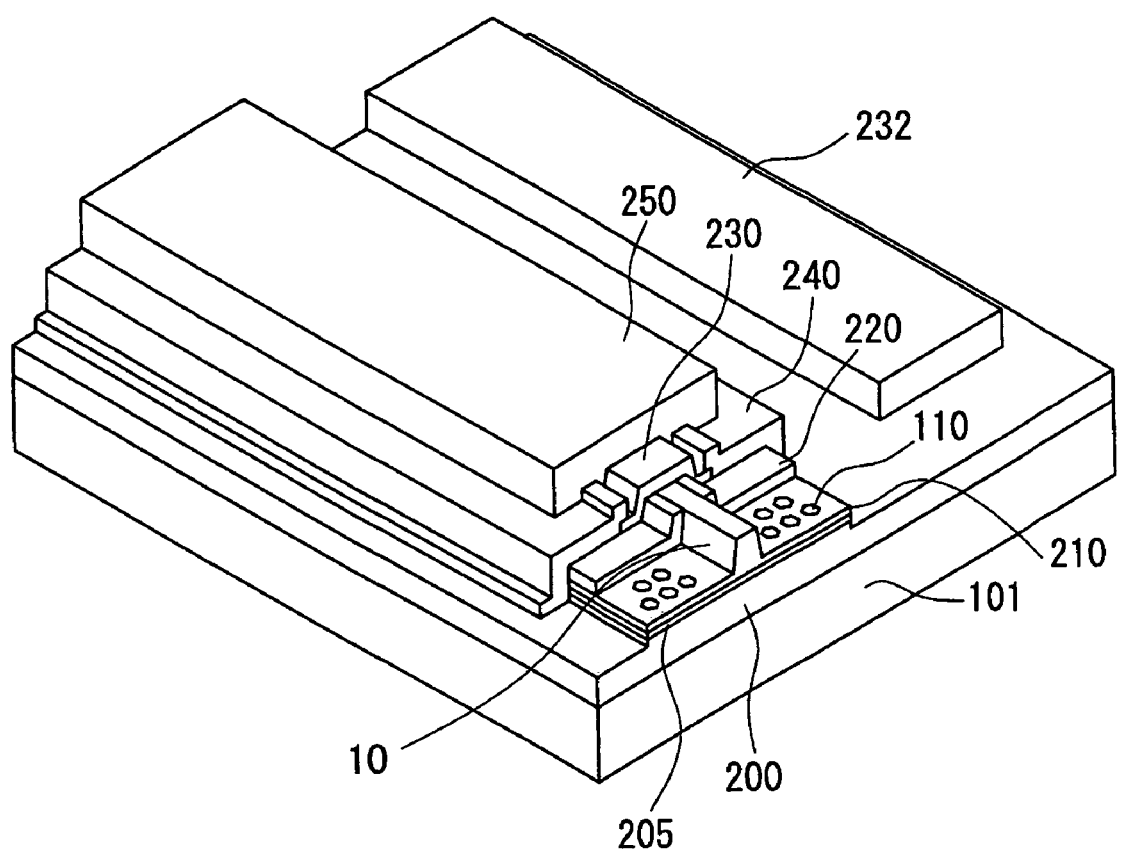
FIG. 11 is a schematic perspective view of the semiconductor laser device according to a third embodiment of the present invention.

FIG. 10B shows an example where the cleavage assisting groove 120 shown in FIG. 10A is formed having a saw teeth shape. The cleavage assisting groove 120 formed in this configuration has sides that are inclined at an angle from the light extracting end face. Therefore, the cleavage assisting groove 120 has the function to scatter and/or refract the leaking light as well. In other words, the cleavage assisting groove 120 shown in FIG. 10B serves also as the recesses 110 of the present invention. Moreover, as shown in FIG. 10C, the cleavage assisting groove 120 may also be formed in a frilled shape having repetitive arched portions. In this case, too, the cleavage assisting groove 120 can scatter and/or refract the leaking light and therefore serve also as the recesses 110.

In this embodiment, it is preferable to form the cleavage assisting groove 120 in the etching process in which the recesses 110 are formed. It is further preferable that the recesses 110 and the cleavage assisting groove 120 are formed at the same time as the etching for exposing the exposed surface 200a of the n-side nitride semiconductor. This reduces the number of mask aligning operations required when etching, improves the yield of manufacturing and stabilizes the characteristics of the laser.

Embodiment 3

The semiconductor laser device of this embodiment has both the p electrode 230 and the n electrode 232 formed on the first principal surface of the substrate 101. That is, the semiconductor layer 200 of the first conductivity type, the active layer 205 and the semiconductor layer 210 of the second conductivity type having a conductivity type different from that of the semiconductor layer 200 of the first conductivity type are stacked on the first principal surface of the substrate 101. The semiconductor layer 210 of the second conductivity type, the active layer 205 and a part of the semiconductor layer 200 of the first conductivity type are etched, thereby exposing the semiconductor layer 200 of the first conductivity type. The n electrode 232 is formed on the semiconductor layer 200 of the first conductivity type that is exposed. This embodiment is similar to the first embodiment in other regards. With the construction of this embodiment, the substrate is not limited to electrically conductive substrate such as GaN or SiC, and an insulating substrate such as sapphire may also be used. The semiconductor laser device of the present invention may have, apart from this embodiment, such a construction as the semiconductor layer of the first conductivity type includes an n-type semiconductor layer and the semiconductor layer of the second conductivity type includes a p-type semiconductor layer.

In this embodiment, the recesses 110 are preferably formed at the same time as the etching for exposing the surface where the n electrode 232 is to be formed. In case the cleaving assisting groove is formed as in the second embodiment, it is preferable to carry out this operation at the same time. This reduces the number of mask aligning operations required when etching, improves the yield of manufacturing and stabilizes the characteristics of the laser.

Embodiment 4

Figure 12:
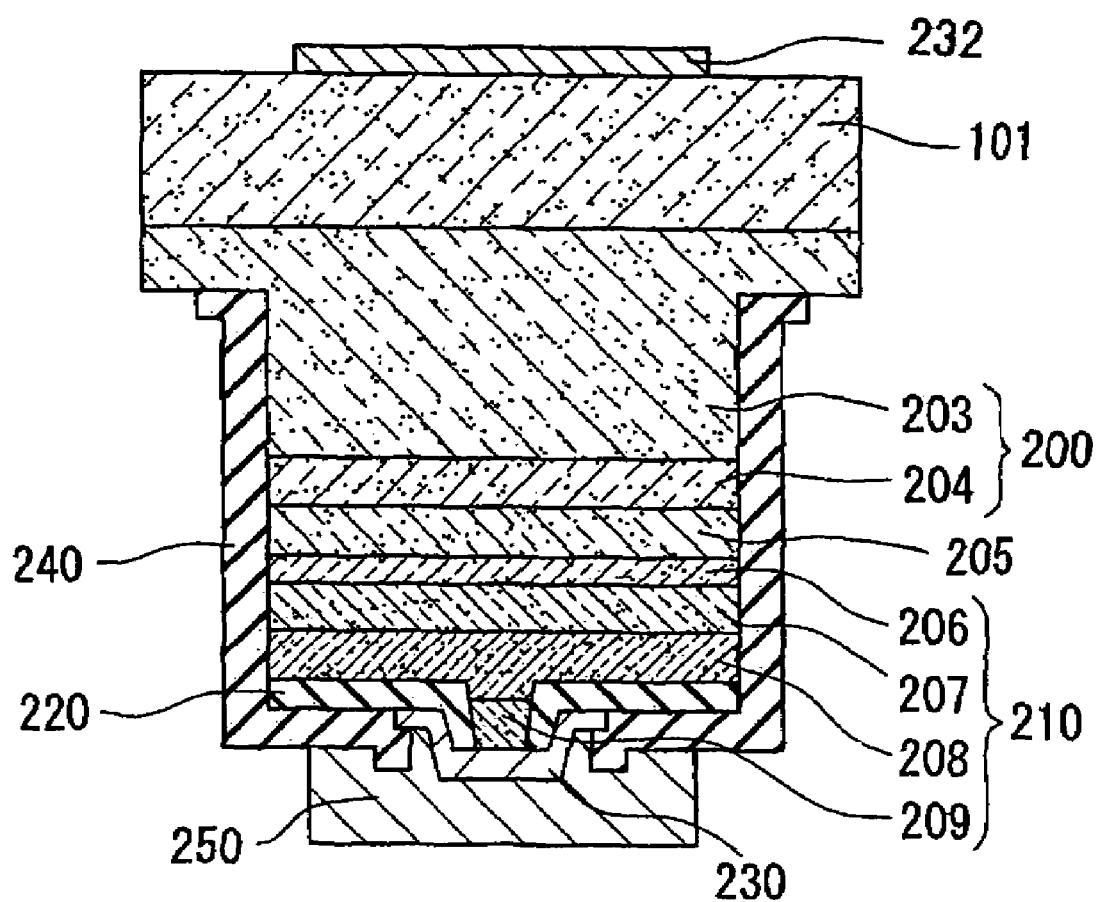
FIG. 12 is a schematic cross sectional view of the semiconductor laser device according to a fourth embodiment.

In this embodiment, a p pad electrode 250 of the semiconductor layer is used as the mounting surface onto the heat sink as shown in FIG. 12. This embodiment is similar to the first embodiment in other regards. A metalizing layer (bump), instead of a wire, for connecting external electrode or the like is formed on the p pad electrode 250, in a face-down structure. The p pad electrode 250 may be used together with the metalizing layer. The metalizing layer (not shown) may be formed from Ag, Au, Sn, In, Bi, Cu, Zn or the like in a single layer or a multi-layer structure. Use of the nitride semiconductor substrate makes it possible to provide the nitride semiconductor device having face-down structure with good reproducibility. The structure of this embodiment improves heat dissipation and reliability.

Embodiment 5

In this embodiment, the p electrode 230 is formed only on the p-side contact layer 209. This embodiment is similar to the first embodiment in other regards. Generally, the insulation layer 220 and the p electrode 230 do not bond well with each other. With the structure of this embodiment, since the insulation layer 220 and the p electrode 230 do not make contact with each other, the p electrode 230 hardly peel off in the interface between the insulation layer 220 and the p electrode 230.

Embodiment 6

In this embodiment, an ion implantation region 130 is formed in addition to the recesses 110. The ion implantation region 130 absorbs light leaking from the waveguide and suppresses ripples.

Figure 13:
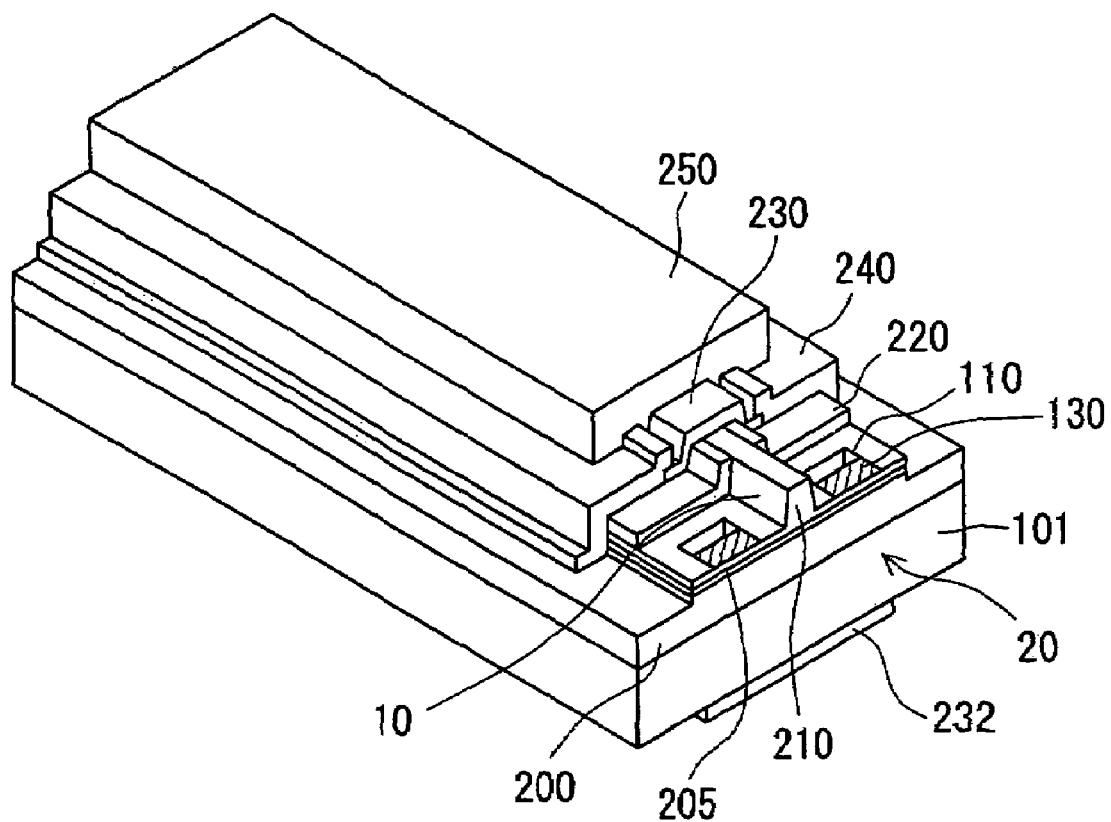
FIG. 13 is a schematic perspective view of the semiconductor laser device according to a fifth embodiment of the present invention.

FIG. 13 is a perspective view showing semiconductor laser device of this embodiment. The semiconductor laser device is similar to the semiconductor laser device of the first embodiment except for the points described below. The ion implantation region 130 and the recesses 110 are formed in this order from the light extracting end face 20 side on the surface of the p-type nitride semiconductor layer 210, at a position located away from the side face of the ridge 10. Multiple ion implantation regions 130 and recesses 110 may be formed. Preferably, the ion implantation region 130 and the recesses 110 are formed on both sides of the ridge 10.

The ion implantation region 130 and the recesses 110 have combined effects of creating a favorable shape of a FFP and providing a semiconductor laser device having a good optical characteristic. The ion implantation region 130 has an effect of absorbing stray light that has leaked from the waveguide. In this embodiment, the ion implantation region 130 is formed by injecting ions into the surface of the p-type nitride semiconductor layer 210 that is exposed, after forming the recesses 110.

The ion implantation region 130 may be formed, for example, as described below. Areas other than that to become the ion implantation region are masked with a Si oxide film, a Si nitride film or a resist film. Ions are accelerated with an energy in a range from 10 to 300 keV, and preferably from 20 to 30 keV so as to pass through the openings of the mask. The depth of ion implantation from the surface can be controlled by adjusting the acceleration voltage for the ions and the duration of ion implantation. The depth of the ion implantation region 130 from the surface is, for example, in a range from 20 Å to 2 µm, and preferably reaching the active layer. Furthermore, it is preferable that the ion implantation region 130 reaches the n-side optical guide layer, and more preferably reaches the n-side cladding layer. With this configuration, stray light that has leaked from the waveguide can be absorbed more efficiently. When the ion implantation region is formed by ion implantation, there are substantially no ions in the region very close to surface of the p-side semiconductor layer 210. However, this does not cause a problem as long as stray light that has leaked from the waveguide can be absorbed.

There is another method for forming the ion implantation region 130, wherein an ion source provided on the ion implantation region 130 by vapor deposition is heated so as to diffuse. The temperature of the heat treatment is preferably in a range from 300 to 1000° C., and more preferably from 500 to 700° C. The duration of the heat treatment is preferably in a range from 1 minute to 2 hours.

The recesses 110 are formed at positions located away from the light extracting end face 20 than the ion implantation region 130. At least two recesses 110 are formed on both sides of the stripe-shaped ridge. It is preferable that depth of the recess 110 is in a range from 20 Å to 3 µm, and preferably reaching the n-type nitride semiconductor layer 200. This is because the optical waveguide region reaches the n-type nitride semiconductor layer 200.

The method for forming the recesses 110 and their shape are similar to those of the first embodiment. That is, the recesses 110 can be formed by etching using a mask. When dry etching is used in this process, the side face of the recess can be made either perpendicular to or inclined from the surface. The planar configuration of the recess may be a rectangle, a circle, a triangle, a hexagon, a parallelogram or the like.

The method for manufacturing the semiconductor laser device of this embodiment will now be described.

The process is the same as that of the first embodiment up to the point where the ridge 10 is formed. After forming the ridge 10, the ion implantation region 130 and the recesses 110 are formed on the surface of the p-type nitride semiconductor layer 210. The ion implantation region 130 is formed first. A resist pattern having an opening that corresponds to the ion implantation region is formed by a photolithography technique. Then the ions are injected through the opening of the resist film by means of an ion implantation apparatus. The acceleration voltage is preferably 30 keV or higher. The dose of ions is preferably in a range from $5 \times 10^{15}$ to $5 \times 10^{20}$, and more preferably in a range from $1 \times 10^{16}$ to $1 \times 10^{20}$ atoms/cm$^2$. The ion implantation region 130 is formed at a position located away from the ridge 10. The distance between the ridge and the end of the ion implantation region 130 is preferably at least 0.5 µm. Then the resist pattern is removed by means of a release liquid.

Then the recesses 110 are formed on the p-type semiconductor layer 210. A resist pattern having openings is formed by a photolithography technique at a position located away from the ridge 10 in the vicinity of the light extracting end face 20. The resist pattern has a circle, triangle, hexagon or other shape to form the planar configuration of the recesses. The thickness of the resist pattern may be such that it allows etching of the nitride semiconductor layer. The depth of etching that determines the depth of the recesses is such that reaches the n-side cladding layer 203. The width of the recess 10 is preferably 1 µm or larger in the direction of stripe of the ridge 10. The width of the recesses 110 formed on both sides of the ridge 10 may be similar to that of the ion implantation region 130. The depth of the recesses 110 is preferably in a range from 20 Å to 3 µm, and more preferably in a range from 0.1 µm to 2 µm. Then the resist pattern is removed by means of a release liquid.

Figure 14:
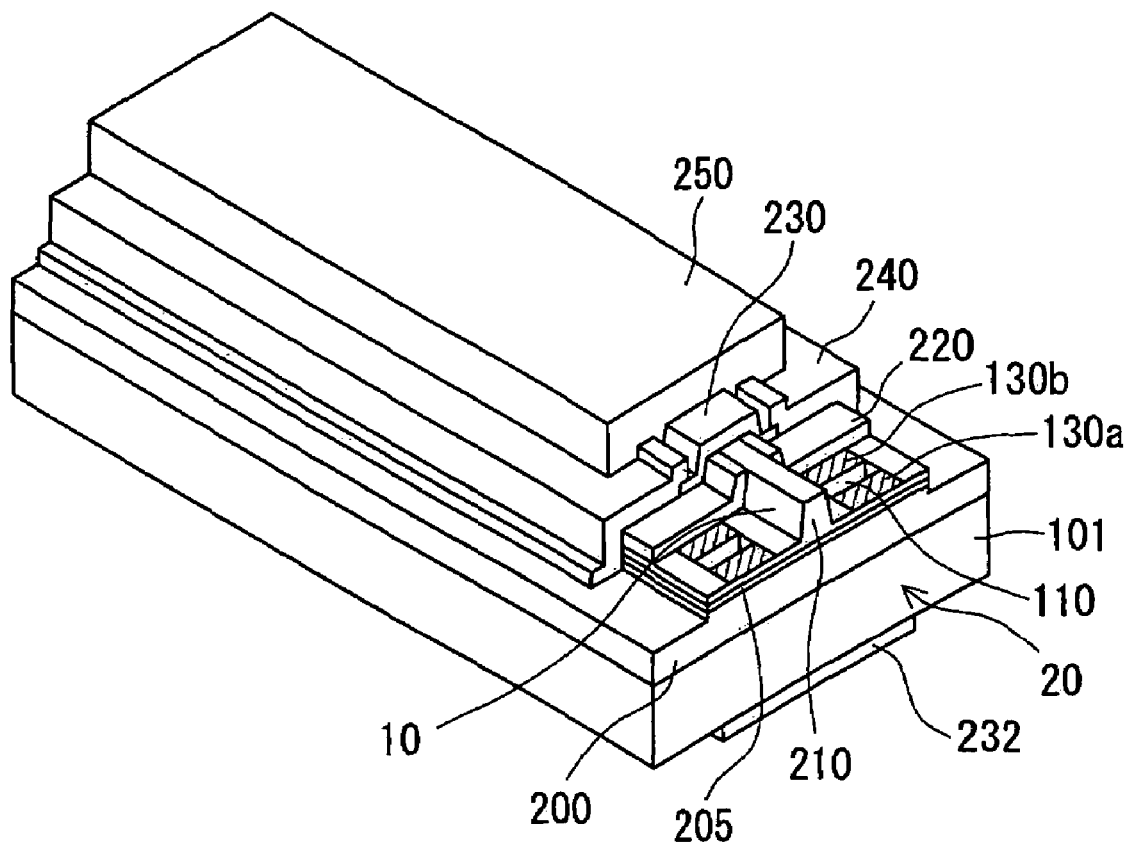
FIG. 14 is a schematic perspective view showing a variation of the semiconductor laser device according to the second embodiment.

After forming the ion implantation region in a wide region as shown in FIG. 14, the recesses 110 are formed within the ion implantation region 130, thereby to form the first ion implantation region 130a, the recesses 110 and second ion implantation region 130b in this order from the light extracting end face side of the resonance surface. Then the semiconductor laser device is manufactured similar to the first embodiment.

Embodiment 7

The semiconductor laser device of this embodiment has both the p electrode 230 and the n electrode 232 formed on the first principal surface of the substrate 101, as shown in the third embodiment. This embodiment is similar to the sixth embodiment in other regards.

Embodiment 8

The semiconductor laser device of this embodiment is a variation of the semiconductor laser device of the sixth embodiment, and has the light absorbing layer 111 formed on the inside of the recess 110. This embodiment is similar to the sixth embodiment in other regards. The light absorbing layer 111 is similar to that described in the first embodiment.

Embodiment 9

In this embodiment, the p pad electrode of semiconductor layer is used as the mounting surface onto the heat sink similar to the fourth embodiment. This embodiment is similar to the sixth embodiment in other regards.

In any of Embodiments 1 to 9, any method known in the prior art for growing the nitride semiconductor can be used such as MOVPE (metal organic chemical vapor phase epitaxy), HVPE (halide vapor phase epitaxy) or MBE (molecular beam vapor phase epitaxy).

In Embodiments 1 to 9, semiconductor laser devices having the ridge 10 with a stripe shape formed thereon have been described. However, the present invention can also be applied to a semiconductor laser device having a waveguide formed by means of current restricting layer instead of the ridge 10. The current restricting layer is a layer that can selectively flow current into a region that would become the waveguide. The current restricting layer may be made of, for example, AlN. The current restricting layer may be located between the active layer and the p-side contact layer, and is preferably formed on the p guide layer. The distance between the current restricting layers is preferably in a range from 0.5 µm to 3 µm. The thickness of the current restricting layer is preferably in a range from 100 Å to 1 µM.

EXAMPLES

Examples of the semiconductor laser device according to the present invention will now be described below. It should be noted, however, that the present invention is not limited to these examples.

Example 1

A substrate made of sapphire or GaAs is placed in an MOCVD reaction apparatus where the temperature is set to 500° C. A buffer layer made of GaN having a thickness of 200 Å by using trimethyl gallium (TMG) and ammonia (NH$_3$). After growing the buffer layer, the temperature is changed to 1050° C. and a base layer made of GaN having a thickness of 4 μm is grown.

After growing the base layer, the wafer is taken out of the reaction vessel and a photo mask having a stripe pattern is formed on the surface of the base layer. Then a protective film made of SiO$_2$ having a width of the stripe in a range from 10 to 300 μm and a spacing of the interval (window) in a range from 5 to 300 μm is formed by a CVD apparatus.

After forming the protective layer, the wafer is transferred into an HVPE (halide vapor phase epitaxy) apparatus, in which the nitride semiconductor of GaN having thickness of 400 μm is formed by using metal Ga, HCl gas and ammonia as the stock material while doping with oxygen as the n-type impurity. When a thick film of GaN is grown to a thickness of 100 μm or more while growing the nitride semiconductor on the protective film by HVPE process, crystal defects are reduced by two orders of magnitude or more in number. The nitride semiconductor substrate is made of GaN prepared by removing the substrate of a different material by polishing, grinding, CMP, irradiation with laser beam or the like. The thickness of the GaN film is about 400 μm. The density of dislocations in the GaN substrate 101 below the waveguide forming region is $1 \times 10^6/cm^2$ or lower.

N-Side Cladding Layer 203

Then a layer of Al$_{0.03}$Ga$_{0.97}$N doped with $1 \times 10^{19}/cm^3$ of Si is formed to a thickness of 2 μm by using TMA (trimethyl aluminum) TMG, ammonia and silane gas at 1050° C. The n-side cladding layer may also be formed in super lattice structure.

N-Side Optical Guide Layer 204

With the silane gas stopped, the n-side optical guide layer is formed to a thickness of 0.175 μm from undoped GaN at 1050° C. The n-side optical guide layer may be doped with n-type impurity.

Active Layer 205

With the temperature set to 800° C., barrier layer made of Si-doped In$_{0.02}$Ga$_{0.98}$N is formed to a thickness of 140 Å, and then a well layer made of undoped In$_{0.07}$Ga$_{0.93}$N is grown to a thickness of 70 Å at the same temperature. The barrier layer and the well layer are stacked one on another twice, with one of the barrier layers at the end, thereby to form the active layer having a multiple quantum well (MQW) structure and a total thickness of 560 Å.

P-Side Cap Layer 206

With the temperature raised to 1050° C., a p-side cap layer having band gap energy higher than that of the p-side optical guide layer is formed from p-type Al$_{0.25}$Ga$_{0.75}$N doped with $1 \times 10^{20}/cm^3$ of Mg to a thickness of 100 Å, using TMG, TMA, ammonia and Cp$_2$Mg (cyclopentadienyl magnesium). The p-side cap layer may be omitted.

P-Side Optical Guide Layer 207

With the supplies of Cp$_2$Mg and TMA stopped, the p-side optical guide layer having band gap energy lower than that of the p-side cap layer 10 is formed from undoped GaN to a thickness of 0.14 μm at 1050° C.

P-Side Cladding Layer 208

Then at a temperature of 1050° C., a layer of undoped Al$_{0.10}$Ga$_{0.90}$N is grown to a thickness of 25 Å and, with the supplies of Cp$_2$Mg and TMA stopped, a layer of undoped GaN is grown thereon to thickness of 25 Å, thereby to form the p-side cladding layer of a super lattice structure having a total thickness of 0.4 μm.

P-Side Contact Layer 209

Last, at a temperature of 1050° C., the p-side contact layer of p-type GaN doped with $1 \times 10^{20}/cm^3$ of Mg is formed to a thickness of 150 Å on the p-side cladding layer.

The wafer having the nitride semiconductor layers formed thereon is taken out of the reaction vessel, and a protective mask is formed from SiO$_2$ on the surface of the uppermost p-side contact layer, and is etched with SiCl$_4$ gas by RIE (reactive ion etching) process. Thus the n-side cladding layer is exposed, so that a stripe structure having width of 400 μm in the direction parallel to the light extracting end face is formed. This portion makes the resonator of the laser device.

Then a stripe-shaped protective film is formed from SiO$_2$ on the surface of the p-side contact layer, and is etched with SiCl$_4$ gas using RIE (reactive ion etching). This results in the formation of the ridge that makes the waveguide region of a stripe shape. The side face of the ridge is then protected by forming the insulation layer 220 made of ZrO$_2$.

Formation of the Recesses 110

A resist pattern having a plurality of openings of a hexagonal shape is formed at a position near the end face of the ridge of the waveguide region and away from the ridge, by photolithography, and is etched with SiCl$_4$ gas by a RIE (reactive ion etching) process so as to reach the n-side cladding layer 203. This results in the formation of hexagonal recesses 110 on the surface of the p-side contact layer. The arrangement of the recesses 110 is similar to that shown in FIG. 4A. Specifically, the recesses 110, each measuring 2 μm in diameter and 1.5 μm in depth, were formed in numbers of 6 in the first column nearest to the light extracting end face, 5 in the second column and 6 in the third column, 17 in all. That is, 17 recesses on either side of the ridge, 34 recesses in all were formed. The shortest distance between centers of the recesses 110a in the first column 110a located at symmetrical positions on both sides of the ridge is 8 μm. The distance from the ridge 10 to the center of the nearest recess 110a is 2.3 μm. The distance between centers of the recesses 110a adjacent to each other is 4 μm. The recesses 110b in the second column are formed at positions 2 μm toward the rear side and 2 μm toward the side face of the laser from the recesses 110a in the first column. The number of the recesses 110b in the second column is set to 5. The shortest distance between the centers of the recesses located at symmetrical positions on both sides of the ridge is 12 μm. The distance from the ridge 10 to the center of the nearest recess 110b is 4.3 μm. The distance between centers of the recesses 110b is the same as that in the first column. The recesses 110c in the third column are formed at positions 4 μm toward the rear side. The number of the recesses 110c in the third column is set to 6, the same as in the recesses 110a in the first column. The shortest distance between centers of the recesses located at symmetrical positions on both sides of the ridge and the distance between centers of the recesses 110c are the same as those of the recesses 110a in the first column.

Then the p electrode 230 is formed from Ni (100 Å)/Au (1500 Å) on the surface of the p-side contact layer 209 and the insulation layer 220. After forming the p electrode, a protective film 240 is formed from Si oxide (SiO$_2$) to a thickness of about 0.5 μm on the p electrode and the embedded film 220 and on the side face of semiconductor layer 200 by sputtering. After forming the p electrode 230, ohmic annealing is applied at 600° C.

Then the p pad electrode 250 is formed continuously from Ni (1000 Å)/Ti (1000 Å)/Au (8000 Å) on the p electrode 230 that is exposed without coverage of the protective film.

Then the n electrode 232 is formed from V (100 Å)/Pt (2000 Å)/Au (3000 Å) on the second principal surface of the nitride semiconductor substrate.

A groove is scribed on the first principal surface of the nitride semiconductor substrate whereon the n electrode, the p electrode and the p pad electrode have been formed. The groove is 10 μm in depth, 50 μm from the side face parallel to the resonance surface and 15 μm in width in the perpendicular direction. The groove is used as the cleavage assisting line to cleave the nitride semiconductor substrate into bars from the side where the n electrode is formed, so as to make the resonance surface on the cleaved surface (plane (1-100), namely the M plane that corresponds to the side face of the crystal of hexagonal prism shape).

A multi-layer dielectric material film is formed from $SiO_2$ and $TiO_2$ on the resonance surface, and the bar is divided in the direction parallel to the p electrode, thereby to obtain the semiconductor laser devices. The material of the dielectric multi layer at the light extracting end face may be different from that at the light reflecting end face. For example, if the multi-layer is made of $Al_2O_3$ at the extracting end face, the multi-layer at the reflecting end face may be made of $SiO_2$ and $ZrO_2$ with intervening $Al_2O_3$ therebetween. Such a structure can improve a COD level of the device. The length of the resonator is set to 300 to 1000 μm. The semiconductor laser device has grooves on the right and left corners on the resonance surface side. The groove measures 10 μm in depth, 30 μm parallel to the resonance surface and 10 μm in width in the perpendicular direction.

Figure 15:
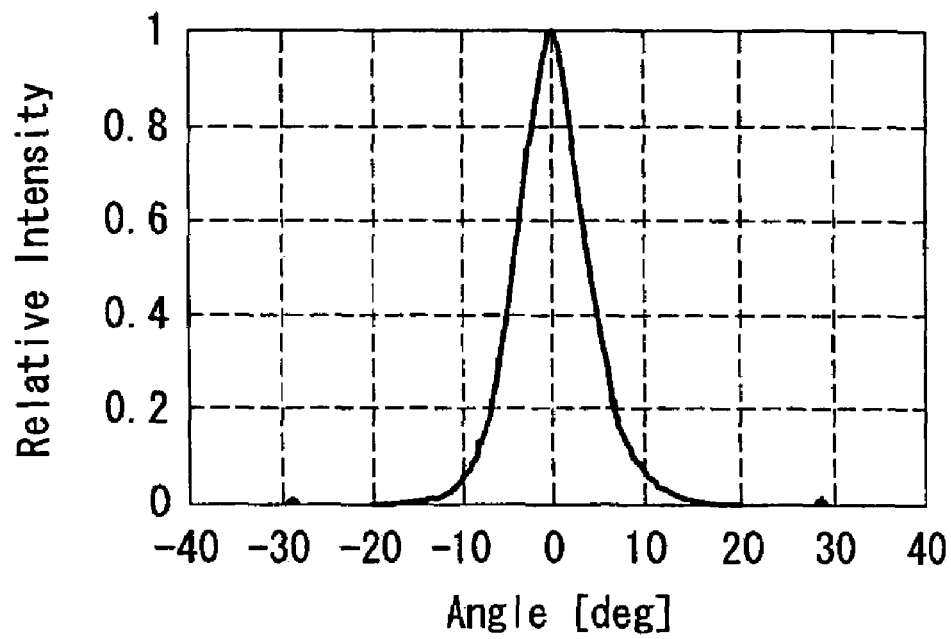
FIG. 15 is a graph showing a FFP in an X direction in Example 1.

The FFP in X direction of the semiconductor laser device made as described above is shown in FIG. 15. As shown in FIG. 15, a good FFP with ripples suppressed is obtained.

Example 2

Figure 6C:
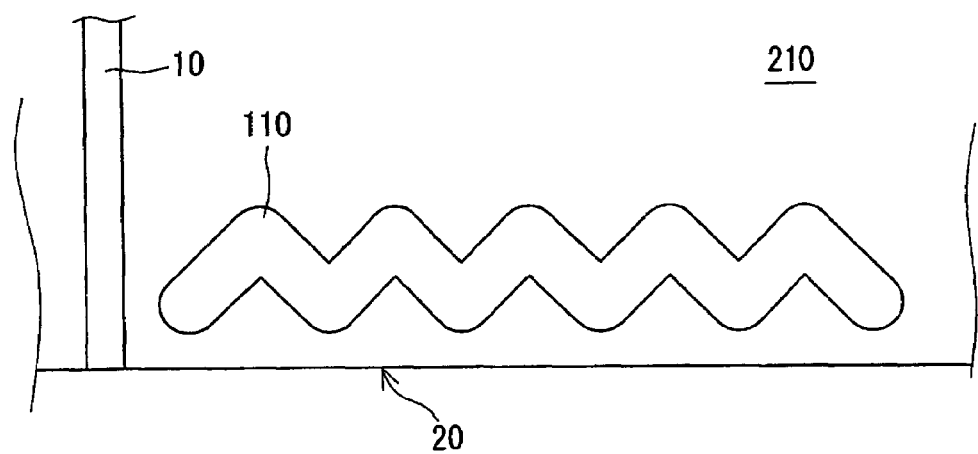
FIG. 6C is a schematic plan view showing another example of curvilinear recesses.

In this example, the recesses 110 having the shape shown in FIG. 6C are formed. With other respects, this example is similar to Example 1. Specifically, the recesses 110a in the first column and the recesses 110b in the second column of Example 1 are displaced by 2 μm toward the rear side. The circles of the first column and the circles of the second column are connected alternately into a pattern consisting of the M-letter shapes connected continuously, so that diameter of each circle is equal to the width of the recess (2 μm). The length of the entire recess in the direction of waveguide is 4 μm, and width perpendicular to the waveguide is 22 μm.

Figure 16:
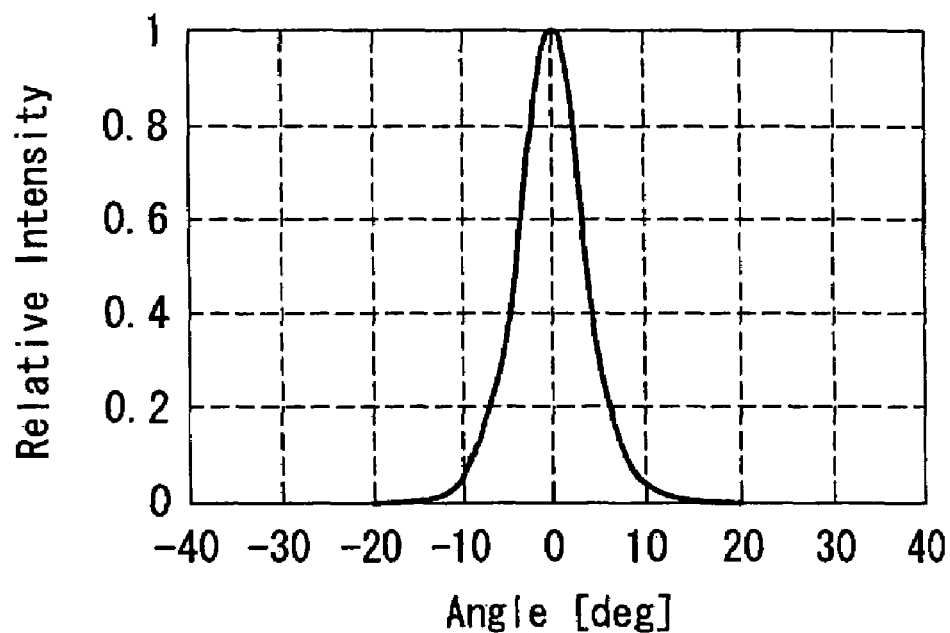
FIG. 16 is a graph showing a FFP in an X direction in Example 2.

The FFP in the X direction of the semiconductor laser device made as described above is shown in FIG. 16. As shown in FIG. 16, a good FFP with ripples suppressed better than in Example 1 is obtained.

Example 3

In Example 2, after the recesses 110 are displaced by 1 μm toward the rear side, the cleavage assisting groove having length of 1 μm in the direction of waveguide is formed from a position 5 μm from the ridge 10 to the side face of the laser element. The depth of the cleavage assisting groove is 1.5 μm. This process is carried out by the same etching operation to form the recesses 110.

In this example, too, a good FFP where ripples are suppressed similar to Example 2 is obtained. In addition, since the cleavage assisting groove is formed, the defect of the deflecting cleaving direction hardly occurs when dividing the wafer into bars.

Comparative Example 1

Figure 17:
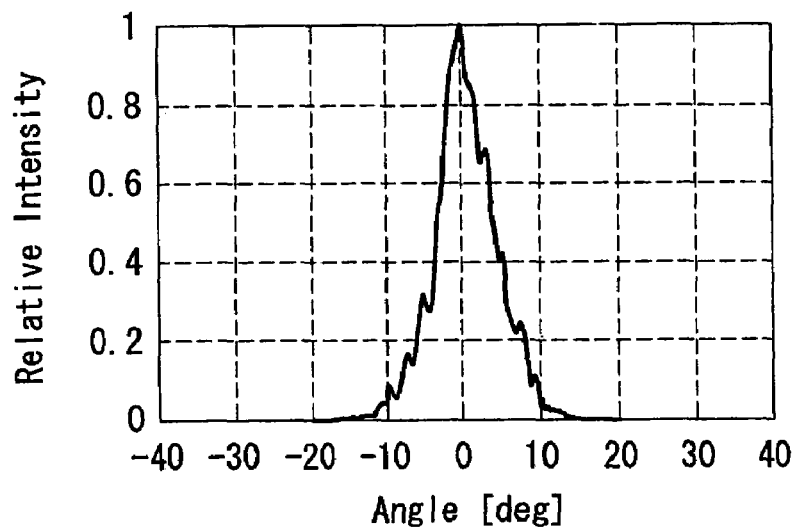
FIG. 17 is a graph showing a FFP in an X direction in Comparative Example 1.

A semiconductor laser device was made similar to Example 1, except that the recesses 110 were not formed in this case. The FFP in the X direction of this semiconductor laser device is shown in FIG. 17. Many ripples are observed in the FFP.

Example 4

The semiconductor laser device was made similar to Example 1, except that the recesses were formed as described below. The recesses, each measuring 2 μm in diameter and 0.5 μm in depth, were formed 5 in number on either side of the ridge, and 10 in all. The five recesses were formed in a group of three and a group of two from the resonator side.

Figure 18:
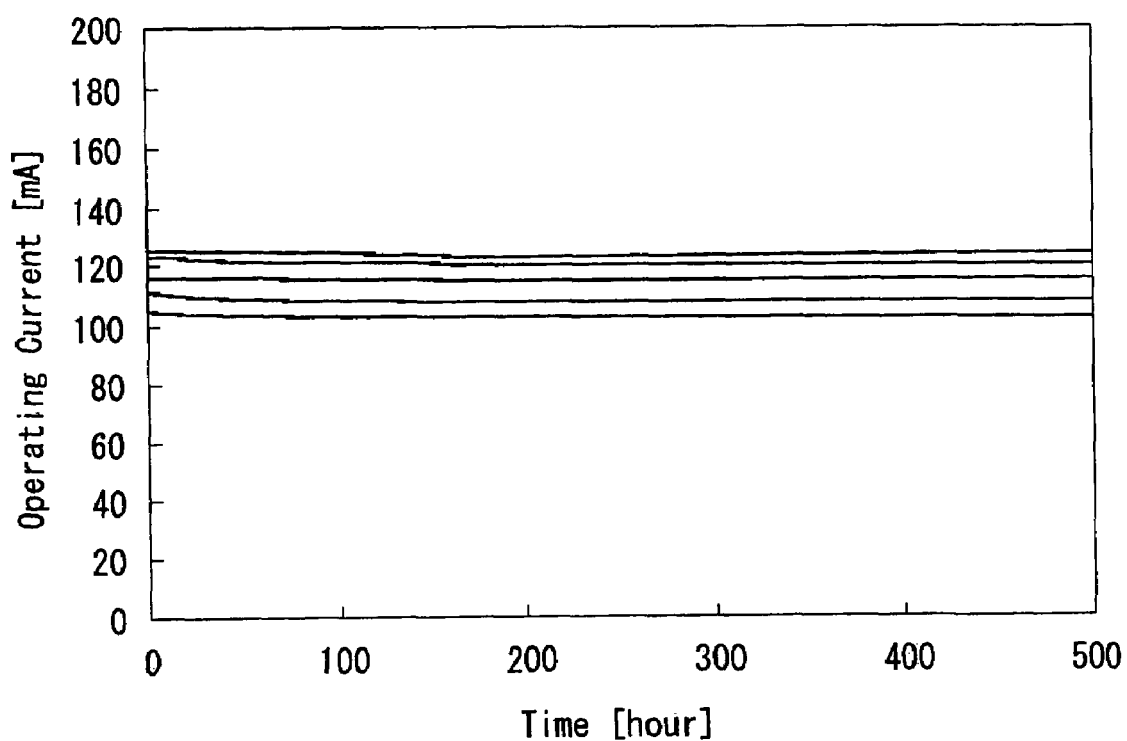
FIG. 18 shows the results of a lifetime test of the semiconductor laser device of Example 4.

The laser element was placed on a heat sink, and a p electrode was connected by wire bonding. At room temperature, the laser showed good continuous oscillation at wavelengths from 400 to 420 nm with a threshold current density of 2.9 kA/cm². When the resonance surface was formed by cleaving, the laser element without cleaving damage having an optical output power of CW80 mW and a long life of 10,000 hours when operated at 70° C. can be manufactured with good reproducibility (see FIG. 18).

Example 5

In Example 4, the nitride semiconductor substrate having a thickness of 500 μm is formed from GaN doped with $1\times10^{18}/cm^3$ of silicon (Si) or oxygen (O) by adding silane gas to the stock material in the HVPE apparatus when forming the nitride semiconductor substrate 101. The concentration of Si is preferably in a range from $1\times10^{17}/cm^3$ to $5\times10^{19}/cm^3$. After growing the nitride semiconductor substrate, the sapphire substrate, the buffer layer or the like is removed by laser irradiation or polishing, similar to Example 1, thereby obtaining the nitride semiconductor substrate 101. The semiconductor laser device is made under similar conditions except for the above, thereby efficiently obtaining the laser device having characteristics similar to those of Example 3.

Example 6

The semiconductor laser device is made under conditions similar to those of Example 1, except for growing the n-side cladding layer via an intermediate layer on the nitride semiconductor substrate 101 in Example 4.

The intermediate layer is formed from GaN doped with $3\times10^{18}/cm^3$ of Si to a thickness of 4 μm on the nitride semiconductor substrate 1 at 1050° C. using ammonia, TMG and silane gas as the impurity gas.

Example 7

The semiconductor laser device is made under conditions similar to those of Example 3, except for growing the n-side cladding layer 203 via an intermediate layer and a crack prevention layer on the nitride semiconductor substrate 101 in Example 4.

The crack prevention layer is grown from $In_{0.06}Ga_{0.94}N$ to a thickness of 0.15 μm by setting the temperature to 800° C. and using TMG, TMI (trimethyl indium) and ammonia.

Example 8

In Example 4, the n-side cladding layer is formed in a super lattice structure. In other regards, the semiconductor laser device is made under conditions similar to those of Example 3. The n-side cladding layer of this example is formed by growing a layer of undoped $Al_{0.1}Ga_{0.9}N$ to a thickness of 25 Å using TMA (trimethyl aluminum), TMG and ammonia at 1050° C., then with the supply of TMA stopped and flowing silane gas, growing an n-type GaN layer doped with $1\times10^{19}/cm^3$ of silicon to a thickness of 25 Å. These layers are stacked alternately so as to form a super lattice layer having a total thickness of 2 µm.

Example 9

In this example, the semiconductor laser device shown in FIG. 13 is made. The construction of layers is substantially the same as that shown in FIG. 2, although the depth of the ridge is different.

GaN Substrate 101

The substrate 101 is made of GaN having a principal surface in the C plane measuring 2 inches in diameter and 400 µm in thickness and is set in an MOVPE reaction vessel. The number density of the crystal defects in the GaN substrate 101 is $10^5/cm^2$ or less.

N-Side Cladding Layer 203

A layer of undoped $Al_{0.16}Ga_{0.84}N$ is grown to a thickness of 25 Å using TMA (trimethyl aluminum), TMG and ammonia at 1050° C., then with the supply of TMA stopped and flowing silane gas, an n-type GaN layer doped with $1\times10^{19}/cm^3$ of silicon is grown to a thickness of 25 Å. These layers are stacked alternately so as to form the n-side cladding layer 203 of the super lattice layer having total thickness of 1.2 µm.

N-Side Optical Guide Layer 204

With the silane gas stopped, the n-side optical guide layer 204 is formed to a thickness of 0.1 µm from undoped GaN at 1050° C. The n-side optical guide layer may be doped with an n-type impurity.

Active Layer 205

With the temperature set to 800° C., a barrier layer made of Si-doped $In_{0.05}Ga_{0.95}N$ is formed to a thickness of 100 Å, then a well layer made of undoped $In_{0.2}Ga_{0.8}N$ is grown to a thickness of 75 Å at the same temperature. The barrier layer and the well layer are stacked one on another twice, with one of the barrier layers at the end, thereby forming the active layer 205 having a multiple quantum well (MQW) structure and a total thickness of 450 Å.

P-Side Electron Confinement Layer 206

With the temperature raised to 1050° C., the p-side electron confinement layer 206 having a band gap energy higher than that of the p-side optical guide layer 207 is formed from p-type $Al_{0.3}Ga_{0.7}N$ doped with $1\times10^{20}/cm^3$ of Mg to a thickness of 100 Å, using TMG, TMA, ammonia and $Cp_2Mg$ (cyclopentadienyl magnesium)

P-Side Optical Guide Layer 207

With the supplies of $Cp_2Mg$ and TMA stopped, the p-side optical guide layer 207 having a band gap energy lower than that of the p-side cap layer 206 is formed from undoped GaN to a thickness of 0.1 µm at 1050° C.

P-Side Cladding Layer 208

Then after growing an undoped $Al_{0.16}Ga_{0.84}N$ layer to a thickness of 25 Å at 1050° C., supplies of $Cp_2Mg$ and TMA are stopped and an undoped GaN layer is grown to a thickness of 25 Å, thereby forming the p-side cladding layer 208 of a super lattice structure having a total thickness of 0.6 µm.

P-Side Contact Layer 209

Last, the p-side contact layer 209 is formed from p-type GaN doped with $1\times10^{20}/cm^3$ of Mg to a thickness of 150 Å on the p-side cladding layer 208 at a temperature of 1050° C.

The wafer having the nitride semiconductor layers formed thereon as described above is taken out of the reaction vessel, and a protective film is formed from $SiO_2$ on the surface of the uppermost p-side contact layer 209, and is etched with $SiCl_4$ gas by a RIE (reactive ion etching) process, thereby to expose the surface of the n-side cladding layer 203.

After forming a first protective film from an Si oxide (mainly $SiO_2$) to a thickness of 0.5 µm over substantially the entire surface of the uppermost p-side contact layer 209 by a PVD apparatus, the first protective film is etched so as to form the first protective film having a stripe width of 2 µm on the p-side contact layer. Furthermore, the p-side contact layer and the p-side cladding layer are etched again with $SiCl_4$ gas by the RIE process, thereby forming the stripe-shaped ridge 10. The width of the ridge is 1.6 µm.

Ion Implantation Region 130

After forming the stripe-shaped ridge 10, a resist pattern is formed on the ridge 10. Then the substrate 101 is set in an ion implantation apparatus. Al ions are implanted into the p-side guide layer 207 that is exposed other than the ridge 10. The acceleration voltage is set to 30 keV, and the dose is set to $1\times10^{16}$ atoms/$cm^2$. The Al ion implantation region 130 is formed on both sides of the ridge. The ion implantation region 130 is formed in area ranging over a width of 5 µm from positions that are located 2 µm away from the ridge to the right and left side, and having a length of 10 µm in the stripe direction of the ridge.

Recesses 110

Then a resist pattern is formed on the ridge 10 and the p-side guide layer 206 by photolithography. The resist pattern has openings formed therein, so that a back area of the ion implantation region is etched with $SiCl_4$ gas by a RIE (reactive ion etching) process. The etching depth of the recess 110 is 0.8 µm, and the bottom of the recess reaches the n-side cladding layer 203. The recesses 110 are formed in area 5 µm from the ridge to the right and left side, and 2 µm in the stripe direction of the ridge. Then the resist pattern is removed by means of a release liquid.

Then the insulation layer 220 is formed from $ZrO_2$ on both sides of the ridge. The p electrode 230 is formed from Ni (100 Å)/Au (1500 Å) on the surface of the p-side contact layer 209 and the insulation layer 220. After forming the p electrode, the protective film 240 is formed from Si oxide ($SiO_2$) to a thickness of 0.5 µm on the p electrode and the insulation film 220 and on the side face of the nitride semiconductor layer 200 by sputtering. After forming the p electrode 230, ohmic annealing is applied at 600° C.

Then the p pad electrode 250 is formed continuously from Ni (1000 Å)/Ti (1000 Å)/Au (8000 Å) on the p electrode 230 that is exposed without coverage of the protective film.

Then the n electrode 232 is formed from V (100 Å)/Pt (2000 Å)/Au (3000 Å) on the second principal surface of the nitride semiconductor substrate.

A groove is scribed on the first principal surface of the nitride semiconductor substrate whereon the n electrode 232, the p electrode 230 and the p pad electrode 250 have been formed. The groove is 10 µm in depth, 50 µm from the side face parallel to the resonance surface and 15 µm in width in the perpendicular direction. The groove is used as the cleavage assisting line for cleaving the nitride semiconductor substrate into bars from the side where the n electrode is formed, so as to make the resonance surface on the cleaved surface (the plane (1-100), namely the M plane that corresponds to the side face of the crystal of a hexagonal prism shape).

A multi-layer dielectric material film is formed from $SiO_2$ and $TiO_2$ on the resonance surface, and the bar is divided in a direction parallel to the p electrode, thereby to obtain the semiconductor laser devices in the form of chips. The length of the resonator is set to a range from 300 to 1000 μm.

Figure 19:
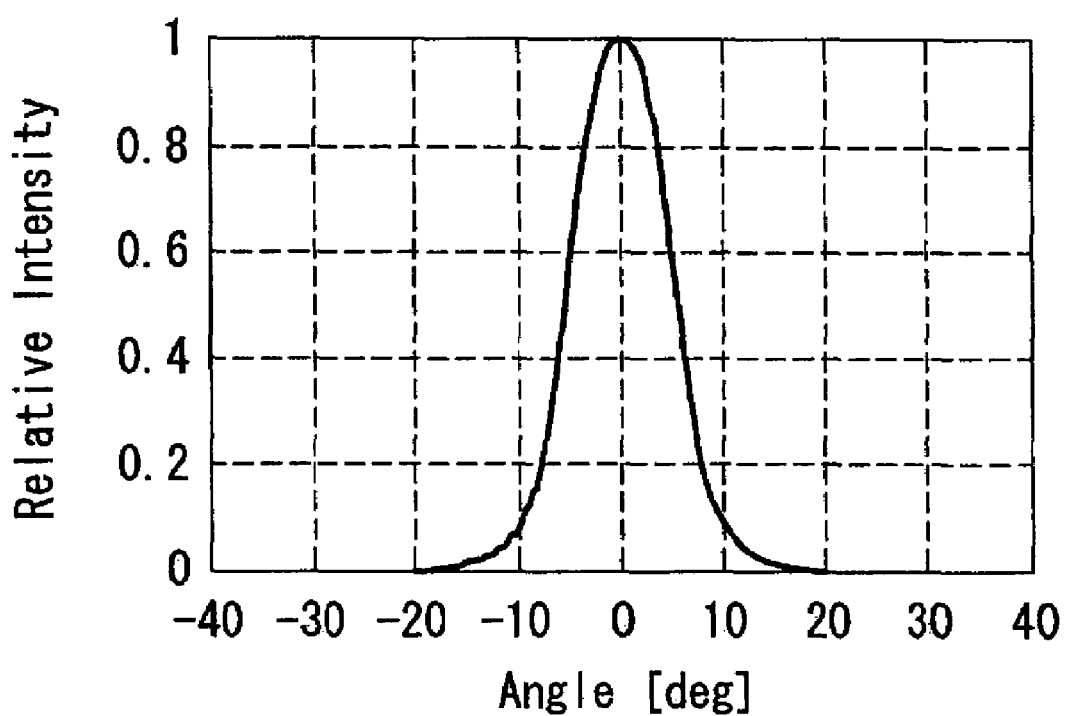
FIG. 19 is a graph showing a FFP in the X direction of Example 9.

The laser element was placed on a heat sink, and a p electrode was connected by wire bonding. At room temperature, the laser showed good continuous oscillation at wavelengths from 400 to 420 nm with a threshold current density of 2.9 $kA/cm^2$. When the resonance surface was formed by cleaving, the laser device without cleaving damage is obtained having an optical output power of CW80 mW and a long life of 10,000 hours when operated at 70° C. The FFP in the X direction of this laser device is shown in FIG. 19. This laser device operates in a single mode with ripples suppressed in the FFP of a good Gaussian shape.

Example 10

In Example 9, a laser device is made similarly except for forming the first Al ion implantation region, the recesses and the second Al ion implantation region from the light extracting end face side by forming the recesses 120 inside the Al ion implantation region. This greatly improves the efficiency of absorbing stray light.

It is to be understood that although the present invention has been described with regards to preferred embodiments thereof, various other embodiments and variants may occur to those skilled in the art, which are within the scope and spirit of the invention, and such other embodiments and variants are intended to be covered by the following claims.

This application is based on Japanese Patent Application No. 2004-62882 filed on Mar. 5, 2204 and Japanese Patent Application No. 2004-82181 filed on Mar. 22, 2004, the contents of which are incorporated hereinto by reference.

What is claimed is:

1. A semiconductor laser device comprising:
a substrate;
a first semiconductor layer of first conductivity type;
an active layer;
a second semiconductor layer of second conductivity type that is different from the first conductivity type;
a waveguide region that is formed in a stripe shape in said second semiconductor layer so that current is restricted to flow in said waveguide region; and
resonance surfaces that are substantially perpendicular to said waveguide region;
wherein a surface of said second semiconductor layer has a region including at least one recess that is spaced from said waveguide region and is adjacent to one of said resonance surfaces;
wherein the surface of said second semiconductor layer includes a plurality of recesses that are spaced from said waveguide region and are adjacent to one of said resonance surfaces; and
wherein said plurality of recesses have a linear shape, and the recesses have a side inclined with respect to a resonance surface in a plan view so that light incident is deflected on the side of the recesses into a direction different from a direction of a main beam, thereby effectively suppressing ripples.

2. The semiconductor laser device according to claim 1, further comprising an insulation film covering said second semiconductor layer.

3. The semiconductor laser device according to claim 1, wherein said plurality of recesses are spaced from said waveguide region and are adjacent to a light extracting side end face of one of said resonance surfaces, and a portion of said recesses at least one of make contact and intersect with the light extracting side end face of one said resonance surface.

4. The semiconductor laser device according to claim 3, wherein bottoms of said recesses are located in said first semiconductor layer.

5. The semiconductor laser device according to claim 2, wherein said second semiconductor layer, said active layer and said first semiconductor layer are partially removed so that the surface of said first semiconductor layer is exposed, and bottoms of said recesses are located in a plane including the exposed surface of said first semiconductor layer.

6. The semiconductor laser device according to claim 5, further comprising an electrode for said second conductivity type disposed on the surface of said second semiconductor layer and an electrode for the first conductivity type is disposed on the exposed surface of said first semiconductor layer.

7. The semiconductor laser device according to claim 5, further comprising an electrode for said second conductivity type disposed on the surface of said second semiconductor layer and an electrode for the first conductivity type disposed on a back surface of said substrate.

8. The semiconductor laser device according to claim 2, wherein said first conductivity type is n type and said second conductivity type is p type.

9. A semiconductor laser device comprising:
a substrate;
a first semiconductor layer of first conductivity type;
an active layer;
a second semiconductor layer of second conductivity type having conductivity type different from the first conductivity type;
a stripe-shaped ridge formed on said second semiconductor layer; and
a resonance surface that is substantially perpendicular to said ridge;
wherein a light scattering region is provided at least in said second semiconductor layer in a region that is spaced from the side face of said ridge and adjacent to a light extracting end face side of said resonance surface; and
wherein said light scattering region has a side inclined with respect to a resonance surface in a plan view so that light incident to said light scattering region is deflected into a direction different from a direction of a main beam, thereby effectively suppressing ripples.

10. The semiconductor laser device according to claim 2, wherein said plurality of recesses are arranged at equal intervals in a direction perpendicular to said waveguide region.

11. The semiconductor laser device according to claim 10, wherein an arrangement of said plurality of recesses is in a number of columns parallel to said waveguide region.

12. The semiconductor laser device according to claim 2, wherein said plurality of recesses are arranged in a W-letter pattern.

13. The semiconductor laser device according to claim 2, wherein said plurality of recesses have a linear shape, said recesses being inclined so that one side of each of said recesses is close to said resonance surface and another side of each of said recesses is farther from said resonance surface, and wherein a plurality of said recesses having the linear shape are connected to each other so as to make a zigzag shape in cross section.

14. The semiconductor laser device according to claim 13, wherein said plurality of recesses are connected to each other so as to form a W-letter pattern.

15. The semiconductor laser device according to claim 2, wherein a side wall of said plurality of recesses is disposed perpendicular to an upper surface of said substrate.

16. The semiconductor laser device according to claim 3, wherein said plurality of recesses are arranged at equal intervals in a direction perpendicular to said waveguide region.

17. The semiconductor laser device according to claim 16, wherein an arrangement of said plurality of recesses is repeated in columns parallel to said waveguide region.

18. The semiconductor laser device according to claim 16, wherein a first column of said recesses intersects with said light extracting side end face of said resonance surface.

19. The semiconductor laser device according to claim 3, further comprising at least one of said recesses has a triangular shape having a side that is parallel to said light extracting side end face and intersects said light extracting side end face.

20. The semiconductor laser device according to claim 19, wherein at least one of said plurality of recesses has a linear shape, each of said recesses having the linear shape is inclined so that one side of said recess is close to said resonance surface and another side of said recess is farther from said resonance surface, said plurality of recesses having the linear shape are connected to each other so as to form a zigzag shape in cross section, and wherein said plurality of recesses includes a combination of recesses having the linear shape and the at least one recess having the triangular shape.

21. The semiconductor laser device according to claim 3, wherein said plurality of recesses have a linear shape, said recesses being inclined so that one side of each of said recesses is close to said resonance surface and another side of each of said recesses is farther from said resonance surface, and wherein a plurality of said recesses having the linear shape are connected to each other so as to make a zigzag shape in cross section.

22. A semiconductor laser device comprising:
a substrate;
a first semiconductor layer of first conductivity type;
an active layer;
a second semiconductor layer of second conductivity type that is different from the first conductivity type;
a waveguide region that is formed in a stripe shape in said second semiconductor layer so that current is restricted to flow in said waveguide region; and
resonance surfaces that are substantially perpendicular to said waveguide region;
wherein a surface of said second semiconductor layer has a region including a plurality of recesses that are spaced from said waveguide region;
wherein a planar configuration of at least two of the recesses have a linear shape, and one of the recesses has a side inclined with respect to a resonance surface in a plan view and another one of the recesses has a side inclined with respect to a resonance surface at a different angle than that of the one of the recesses in a plan view.

23. The semiconductor laser device according to claim 2, wherein the recess has an inner wall surface, and said insulating film is provided on the inner wall of the recess.

24. The semiconductor laser device according to claim 22, wherein at least one of the recesses has a triangle shape, and a portion of the recess contact and intersect with a light extracting side end face of one said resonance surface.

25. The semiconductor laser device according to claim 22, wherein angle of the side of at least two of recesses with respect to the resonance surface in planar configuration is in a range from 5 to 70 degrees.

26. The semiconductor laser device according to claim 9, wherein said light scattering region includes a side wall inclined relative to an upper surface of said substrate.

27. The semiconductor laser device according to claim 22, wherein a side wall of said plurality of recesses is inclined relative to an upper surface of said substrate.

* * * * *